United States Patent
Kwon et al.

(10) Patent No.: US 9,851,598 B2
(45) Date of Patent: Dec. 26, 2017

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Pil Sook Kwon, Incheon (KR); Seon Uk Lee, Seongnam-si (KR); Jun Heui Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 551 days.

(21) Appl. No.: 14/509,484

(22) Filed: Oct. 8, 2014

(65) Prior Publication Data

US 2015/0355500 A1 Dec. 10, 2015

(30) Foreign Application Priority Data

Jun. 5, 2014 (KR) .................. 10-2014-0068289

(51) Int. Cl.
| | | |
|---|---|---|
| *G02F 1/1343* | (2006.01) | |
| *G02F 1/1335* | (2006.01) | |
| *G02F 1/1333* | (2006.01) | |
| *H01L 27/12* | (2006.01) | |
| *G02F 1/1362* | (2006.01) | |

(52) U.S. Cl.
CPC .. *G02F 1/133514* (2013.01); *G02F 1/133377* (2013.01); *H01L 27/124* (2013.01); *H01L 27/1259* (2013.01); *G02F 2001/136222* (2013.01)

(58) Field of Classification Search
CPC ......... G02F 1/136286; G02F 1/133707; G02F 1/133377; G02F 1/133514; G02F 2001/136222; H01L 27/124; H01L 27/1259

USPC ......................................................... 349/139
See application file for complete search history.

(56) References Cited

U.S. PATENT DOCUMENTS

| | | | |
|---|---|---|---|
| 2012/0062448 A1 | 3/2012 | Kim et al. | |
| 2013/0250220 A1* | 9/2013 | Kim | G02F 1/1341 349/123 |
| 2014/0094080 A1* | 4/2014 | Choi | G02F 1/133377 445/24 |

FOREIGN PATENT DOCUMENTS

| | | |
|---|---|---|
| KR | 1020080054228 | 6/2008 |
| KR | 101108360 | 1/2012 |
| KR | 1020120026880 A | 3/2012 |
| KR | 1020130034277 | 4/2013 |
| KR | 1020140025081 | 3/2014 |
| KR | 1020140112288 A | 9/2014 |
| KR | 1020140137958 | 12/2014 |

* cited by examiner

*Primary Examiner* — Nathanael R Briggs
*Assistant Examiner* — William Peterson
(74) *Attorney, Agent, or Firm* — Innovation Counsel LLP

(57) ABSTRACT

A liquid crystal display according to an exemplary embodiment includes: a substrate; a thin film transistor disposed on the substrate; a pixel electrode connected to the thin film transistor; and color filters disposed to face the pixel electrode, wherein a plurality of microcavities are between the pixel electrode and the color filters, the microcavities form a liquid crystal layer including a liquid crystal material, the microcavities are divided by a partition portion, and the partition portion is formed by a color filter of one color among the color filters.

13 Claims, 30 Drawing Sheets

LIQUID CRYSTAL DISPLAY AND METHOD OF MANUFACTURING THE SAME

CROSS-REFERENCE TO RELATED APPLICATION

This application claims priority to and the benefit of Korean Patent Application No. 10-2014-0068289 filed in the Korean Intellectual Property Office on Jun. 5, 2014, the entire contents of which are incorporated herein by reference.

BACKGROUND (a) Field

The present application relates to a liquid crystal display and a manufacturing method thereof.

(b) Description of the Related Art

A liquid crystal display as one of flat panel display devices that are widely being used includes two display panels where field generating electrodes such as a pixel electrode and a common electrode are formed, and a liquid crystal layer is interposed therebetween.

The liquid crystal display generates an electric field in a liquid crystal layer by applying a voltage to the field generating electrodes, to determine orientations of liquid crystal molecules of the liquid crystal layer and control polarization of incident light, thereby displaying an image.

A technique of implementing a display by forming a plurality of microcavities in a pixel and filling a liquid crystal therein has been developed for one of the liquid crystal displays. This technique may form a structure such as a roof layer to support the microcavities. To form the roof layer, several layers may be required such that a process is complicated.

The above information disclosed in this Background section is only for enhancement of understanding of the background and therefore it may contain information that does not form the prior art that is already known in this country to a person of ordinary skill in the art.

SUMMARY

Embodiments provide a liquid crystal display simplifying a manufacturing process, and a manufacturing method thereof.

A liquid crystal display according to an exemplary embodiment includes a substrate, a thin film transistor, a pixel, and color filters. The thin film transistor is disposed on the substrate. The pixel electrode is connected to the thin film transistor. The color filters are disposed to face the pixel electrode, wherein a plurality of microcavities are disposed between the pixel electrode and the color filters. The microcavities form a liquid crystal layer including a liquid crystal material, and the microcavities are divided by a partition portion. The partition portion includes a color filter of one color among the color filters.

The partition portion may be a portion where the color filter of one color fills a separation space between the microcavities neighboring each other.

The partition portion may be disposed along a direction that a data line connected to the thin film transistor extends.

A lower insulating layer disposed between the microcavities and the color filters may be further included.

The color filters may have an island shape one another.

A boundary surface in which the color filters neighboring each other meet each other may be disposed on the partition portion.

The color filters may include a first color filter, a second color filter, and a third color filter, and three partition portions disposed between the color filters neighboring each other among the first color filter, the second color filter, and the third color filter may include one color filter among the first color filter, the second color filter, and the third color filter.

The color filters may include a first color filter, a second color filter, and a third color filter, and three partition portions disposed between the color filters neighboring each other among the first color filter, the second color filter, and the third color filter may respectively include the first color filter, the second color filter, and the third color filter.

A separation space of the color filters neighboring each other may be disposed on the partition portion, an upper insulating layer covering the separation space may be further included, and the upper insulating layer may include an inorganic layer.

The color filters may include a first color filter, a second color filter, and a third color filter, and the first color filter, the second color filter, and the third color filter may be a blue color filter, a red color filter, and a green color filter, respectively.

The blue color filter may form the partition portion.

An organic layer disposed on the color filters may be further included.

The color filters may include a first color filter, a second color filter, and a third color filter, the first color filter, the second color filter, and the third color filter may be disposed to be separated from each other, and a separation space of the color filters may be filled with the organic layer.

The partition portion may be a portion where the separation space between the microcavities neighboring each other is filled with the color filter of one color.

The first color filter may form the partition portion, and the first color filter may be the blue color filter.

A common electrode and a lower insulating layer disposed between the microcavities and the color filters, an upper insulating layer disposed on the color filters, and a capping layer disposed on the upper insulating layer may be further included.

A manufacturing method of a liquid crystal display according to an exemplary embodiment includes: forming a thin film transistor on a substrate; forming a pixel electrode connected to the thin film transistor; forming a sacrificial layer with an open portion on the pixel electrode; forming a first color filter on the sacrificial layer; forming a second color filter on the sacrificial layer; forming a third color filter on the sacrificial layer; removing the sacrificial layer to form a plurality of microcavities; injecting a liquid crystal material into the microcavities; forming a capping layer to cover a liquid crystal injection hole of the microcavities; and filling the open portion with one color filter among the first color filter, the second color filter, and the third color filter.

The color filter filling the open portion may form the partition portion, and the partition portion may define the microcavities.

The partition portion may be formed along a direction that the data line connected to the thin film transistor extends.

The first color filter, the second color filter, and the third color filter may be formed of an island shape.

Forming a lower insulating layer on the sacrificial layer may be further included.

A boundary surface in which color filters neighboring each other among the first color filter, the second color filter, and the third color filter meet each other may be disposed on the partition portion.

A separation space of color filters neighboring each other among the first color filter, the second color filter, and the third color filter may be formed on the partition portion, the method may further include forming an upper insulating layer covering the separation space, and the upper insulating layer may include an inorganic layer.

The first color filter, the second color filter, and the third color filter may respectively form a blue color filter, a red color filter, and a green color filter, and the blue color filter may form the partition portion.

The method may further include forming an organic layer on the first color filter, the second color filter, and the third color filter.

The first color filter, the second color filter, and the third color filter may be formed to be separated from each other on the partition portion.

The separation space of the first color filter, the second color filter, and the third color filter may be filled with the organic layer.

The first color filter may form the partition portion, and the first color filter may be a blue color filter.

The method may further include: forming an upper insulating layer on the first color filter, the second color filter, and the third color filter; and patterning the upper insulating layer to form a liquid crystal injection hole formation region, and the liquid crystal injection hole formation region may be formed along a direction that a gate line connected to the thin film transistor extends.

According to an exemplary embodiment, by forming the color filters on the microcavities, the roof layer may be replaced. Accordingly, the manufacturing process may be simplified.

DETAILED DESCRIPTION OF THE EMBODIMENTS

Figure 1:
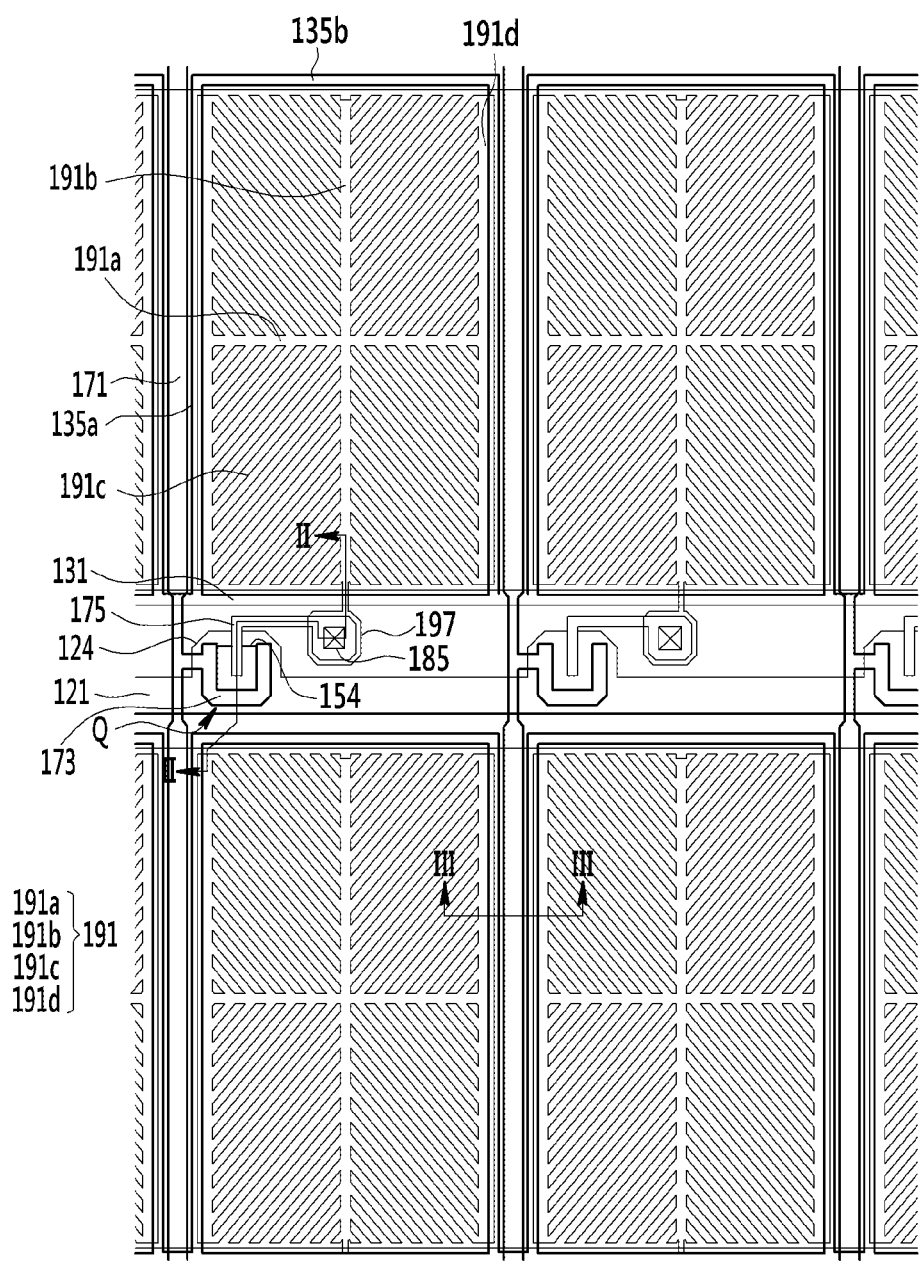
FIG. 1 is a top plan view of a liquid crystal display according to an exemplary embodiment.

Hereinafter, exemplary embodiments will be described in detail with reference to the accompanying drawings. As those skilled in the art would realize, the described embodiments may be modified in various different ways, all without departing from the spirit or scope of the inventive concept. On the contrary, exemplary embodiments introduced herein are provided to make disclosed contents thorough and complete and sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

Figure 2:
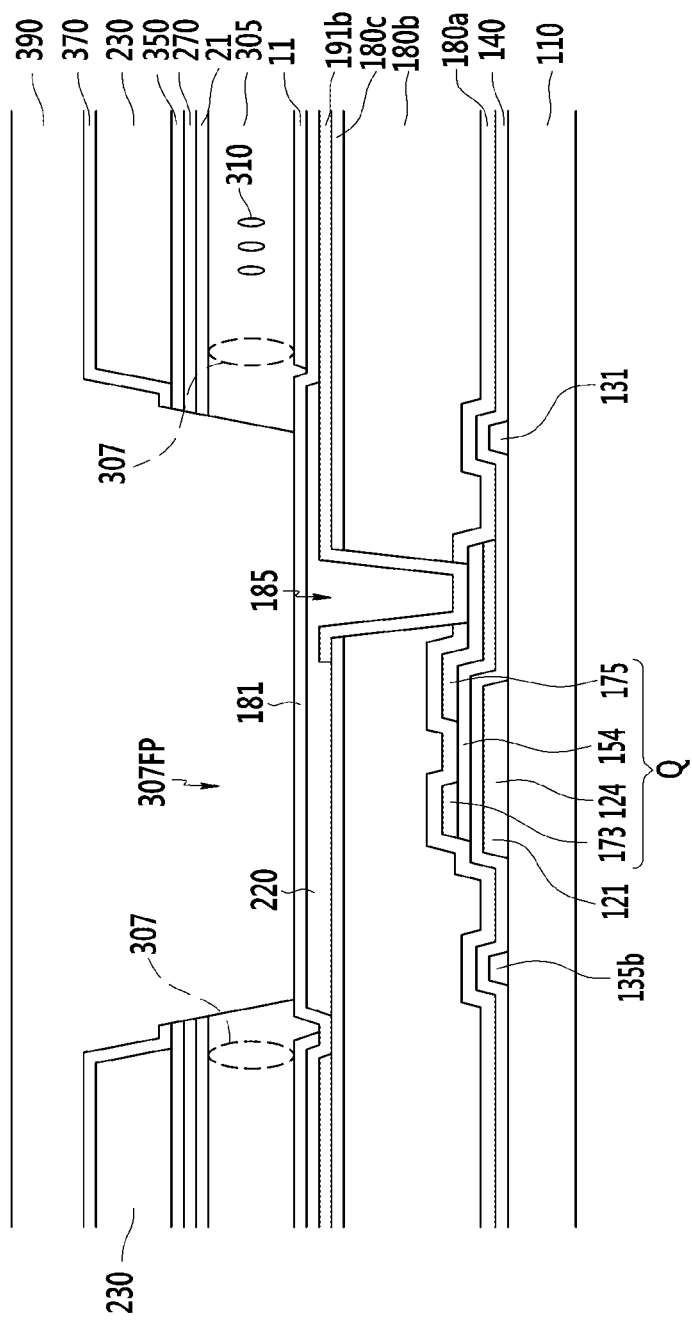
FIG. 2 is a cross-sectional view of the liquid crystal display taken along a line II-II of FIG. 1.
Figure 3:
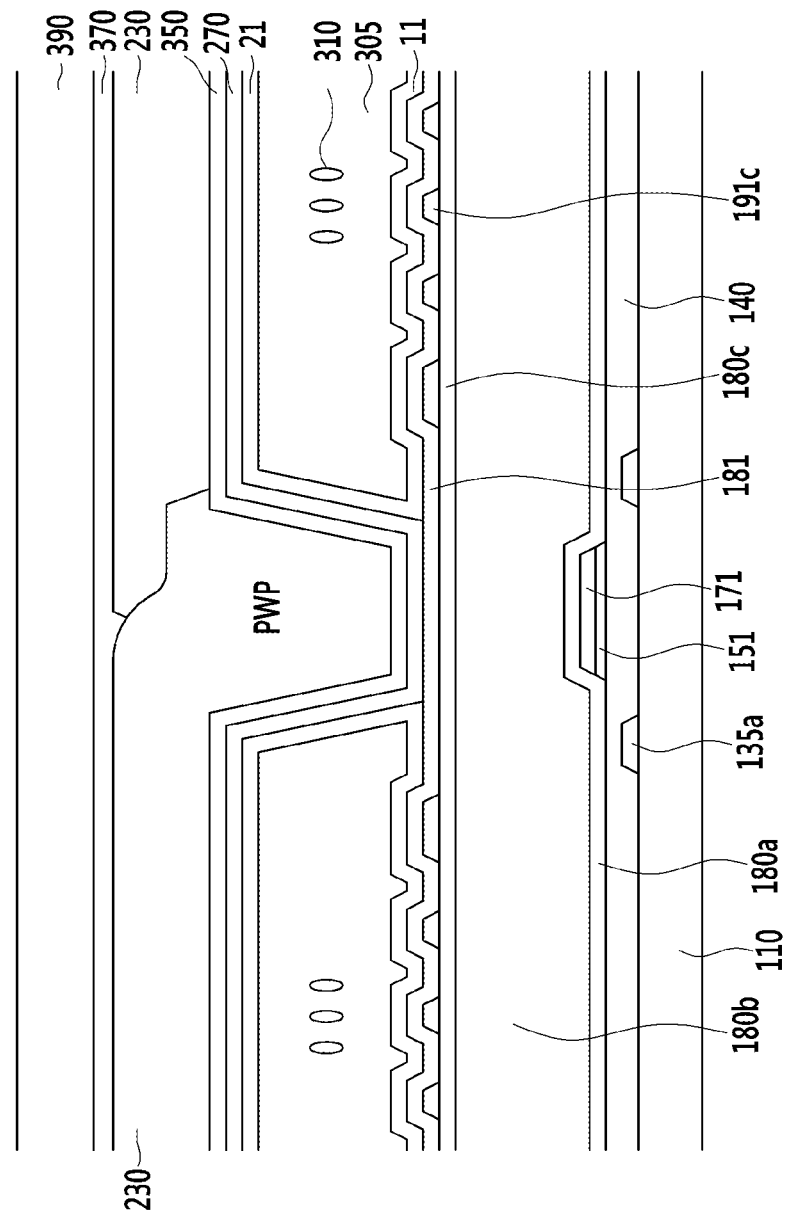
FIG. 3 is a cross-sectional view of the liquid crystal display taken along a line of FIG. 1.

FIG. 1 is a top plan view of a liquid crystal display according to an exemplary embodiment. FIG. 2 is a cross-sectional view of the liquid crystal display taken along a line II-II of FIG. 1. FIG. 3 is a cross-sectional view of the liquid crystal display taken along a line III-III of FIG. 1.

FIG. 1 shows a 2*2 pixel portion as a center portion of a plurality of pixels, and these pixels may be repeatedly arranged up/down and right/left in the liquid crystal display according to an exemplary embodiment.

Referring to FIG. 1 to FIG. 3, a gate line 121 and a storage electrode line 131 are formed on a substrate 110 made of transparent glass or plastic. The gate line 121 includes a gate electrode 124. The storage electrode line 131 is mainly extended in a horizontal direction, and transfers a predetermined voltage such as a common voltage Vcom. The storage electrode line 131 includes a pair of vertical storage electrode portions 135a substantially extended to be perpendicular to the gate line 121, and a horizontal storage electrode portion 135b connecting ends of the pair of vertical storage electrode portions 135a to each other. The vertical and horizontal storage electrode portions 135a and 135b have a structure surrounding a pixel electrode 191.

A gate insulating layer 140 is formed on the gate line 121 and the storage electrode line 131. A semiconductor layer 151 disposed under a data line 171 and a semiconductor layer 154 disposed under a source/drain electrode and corresponding to a channel region of a thin film transistor Q are formed on the gate insulating layer 140.

A plurality of ohmic contacts may be formed between the semiconductor layer 151 and the data line 171, and between the semiconductor layer 154 under the source/drain electrode and corresponding to the channel region and the source/drain electrode, and are omitted in the drawings.

Data conductors 171, 173, and 175 including a source electrode 173, a data line 171 connected to the source electrode 173, and a drain electrode 175 are formed on the semiconductor layers 151 and 154 and the gate insulating layer 140.

The gate electrode 124, the source electrode 173, and the drain electrode 175 form a thin film transistor Q along with the semiconductor layer 154, and the channel of the thin film transistor Q is formed in the exposed portion of the semiconductor layer 154 between the source electrode 173 and the drain electrode 175.

A first interlayer insulating layer 180a is formed on the data conductors 171, 173, and 175 and the exposed semiconductor layer 154. The first interlayer insulating layer 180a may include an inorganic insulator such as a silicon nitride (SiNx) and a silicon oxide (SiOx).

A second interlayer insulating layer 180b and a third interlayer insulating layer 180c may be disposed on the first interlayer insulating layer 180a. The second interlayer insulating layer 180b may be formed of the organic material, and the third interlayer insulating layer 180c may include the inorganic insulator such as the silicon nitride (SiNx) and the silicon oxide (SiOx). The second interlayer insulating layer 180b is formed of the organic material thereby reducing or removing a step. Differently from the present exemplary embodiment, one or two of the first interlayer insulating layer 180a, the second interlayer insulating layer 180b, and the third interlayer insulating layer 180c may be omitted.

A contact hole 185 passing through the first interlayer insulating layer 180a, the second interlayer insulating layer 180b, and the third interlayer insulating layer 180c may be formed. The pixel electrode 191 disposed on the third interlayer insulating layer 180c may be electrically and physically connected to the drain electrode 175 through the contact hole 185. Hereafter, the pixel electrode 191 will be described in detail.

The pixel electrode 191 may be made of a transparent conductive material such as ITO or IZO.

An overall shape of the pixel electrode 191 is a quadrangle, and the pixel electrode 191 includes cross stems configured by a horizontal stem 191a and a vertical stem 191b crossing the horizontal stem 191a. Further, the pixel electrode 191 is divided into four sub-regions by the horizontal stem 191a and the vertical stem 191b, and each sub-region includes a plurality of minute branches 191c. In the present exemplary embodiment, the pixel electrode 191 may further include an outer stem 191d connecting the minute branches 191c at a right and left outer circumference of the pixel electrode 191. In the present exemplary embodiment, the outer stem 191d is disposed at the right and left exterior of the pixel electrode 191, however it may be disposed to extend to an upper portion or a lower portion of the pixel electrode 191.

The minute branches 191c of the pixel electrode 191 form an angle of approximately 40° to 45° with the gate line 121 or the horizontal stem 191a. Further, the minute branches 191c of two adjacent sub-regions may be perpendicular to each other. In addition, a width of each minute branch 191c may be gradually increased, or a distance between the minute branches 191c may be varied.

The pixel electrode 191 includes an extension 197 which is connected at a lower end of the vertical stem 191b, has a larger area than the vertical stem 191b, and is electrically and physically connected to the drain electrode 175 through the contact hole 185 at the extension 197, thereby receiving the data voltage from the drain electrode 175.

The thin film transistor Q and the pixel electrode 191 described above are just described as examples, and a structure of the thin film transistor and a design of the pixel electrode may be modified in order to improve side visibility.

A light blocking member 220 to cover a region where the thin film transistor Q is formed is disposed on the pixel electrode 191. The light blocking member 220 according to the present exemplary embodiment may be formed along a direction that the gate line 121 extends. The light blocking member 220 may be formed of a material that blocks light.

An insulating layer 181 may be formed on the light blocking member 220, and the insulating layer 181 covering the light blocking member 220 may extend on the pixel electrode 191.

A lower alignment layer 11 is formed on the pixel electrode 191, and may be a vertical alignment layer. The lower alignment layer 11, as a liquid crystal alignment layer made of a material such as polyamic acid, a polysiloxane, a polyimide, or the like, may include at least one of generally used materials. Also, the lower alignment layer 11 may be a photoalignment layer.

An upper alignment layer 21 is provided at a portion facing the lower alignment layer 11, and a microcavity 305 is formed between the lower alignment layer 11 and the upper alignment layer 21. A liquid crystal material including liquid crystal molecules 310 is injected into the microcavity 305, and the microcavity 305 has a liquid crystal injection hole 307. The microcavities 305 may be formed along a column direction of the pixel electrode 191, that is, in the vertical direction. In the present exemplary embodiment, the alignment material forming the alignment layers 11 and 21 and the liquid crystal material including the liquid crystal molecules 310 may be injected into the microcavity 305 by using capillary force.

The microcavities 305 are divided in the vertical direction by a plurality of liquid crystal injection hole formation regions 307FP disposed at a portion overlapping the gate line 121, thereby defining the plurality of microcavities 305, and the plurality of microcavities 305 may be formed along a column direction of the pixel electrode 191, that is, in the vertical direction. Also, the microcavities 305 are divided in the horizontal direction by a partition portion PWP that will be described later, thereby defining the plurality of microcavities 305, and the plurality of microcavities 305 may be formed along the row direction of the pixel electrode 191, in other words, the horizontal direction in which the gate line 121 extends. The plurality of formed microcavities 305 may respectively correspond to the pixel area, and the pixel areas may correspond to a region displaying the image.

A common electrode 270 and a lower insulating layer 350 are disposed on the upper alignment layer 21. The common electrode 270 receives the common voltage, and generates an electric field together with the pixel electrode 191 to which the data voltage is applied to determine a direction in which the liquid crystal molecules 310 disposed at the microcavity 305 between the two electrodes 270, 191 are inclined. The common electrode 270 forms a capacitor with the pixel electrode 191 to maintain the received voltage even after the thin film transistor Q is turned off. The lower insulating layer 350 may be formed of a silicon nitride (SiNx) or a silicon oxide (SiOx).

In the present exemplary embodiment, it is described that the common electrode 270 is formed on the microcavity 305, but in another exemplary embodiment, the common electrode 270 is formed under the microcavity 305, so that liquid crystal driving according to a coplanar electrode (CE) mode is possible.

In the present exemplary embodiment, a color filter 230 is disposed on the lower insulating layer 350. As shown in FIG. 3, among the color filters 230 neighboring each other, the color filter 230 of one color forms the partition portion PWP. The partition portion PWP is disposed between the microcavities 305 neighboring in the horizontal direction. The partition portion PWP is a portion filling the separation space of the microcavities 305 neighboring in the horizontal direction. As shown in FIG. 3, the partition portion PWP completely fills the separation space of the microcavity 305, however it is not limited thereto, and it may partially fill the separation space. The partition portion PWP may be formed along the direction that the data line 171 extends.

The color filters 230 neighboring each other on the partition portion PWP may overlap. The boundary surface where the neighboring color filters 230 meet each other may be disposed at the portion corresponding to the partition portion PWP.

In the present exemplary embodiment, the color filter 230 and the partition portion PWP function as a roof layer supporting the microcavity 305 to maintain the shape thereof.

Hereafter, the color filter 230 according to an exemplary embodiment will be described with reference to FIG. 4 and FIG. 5.

Figure 4:
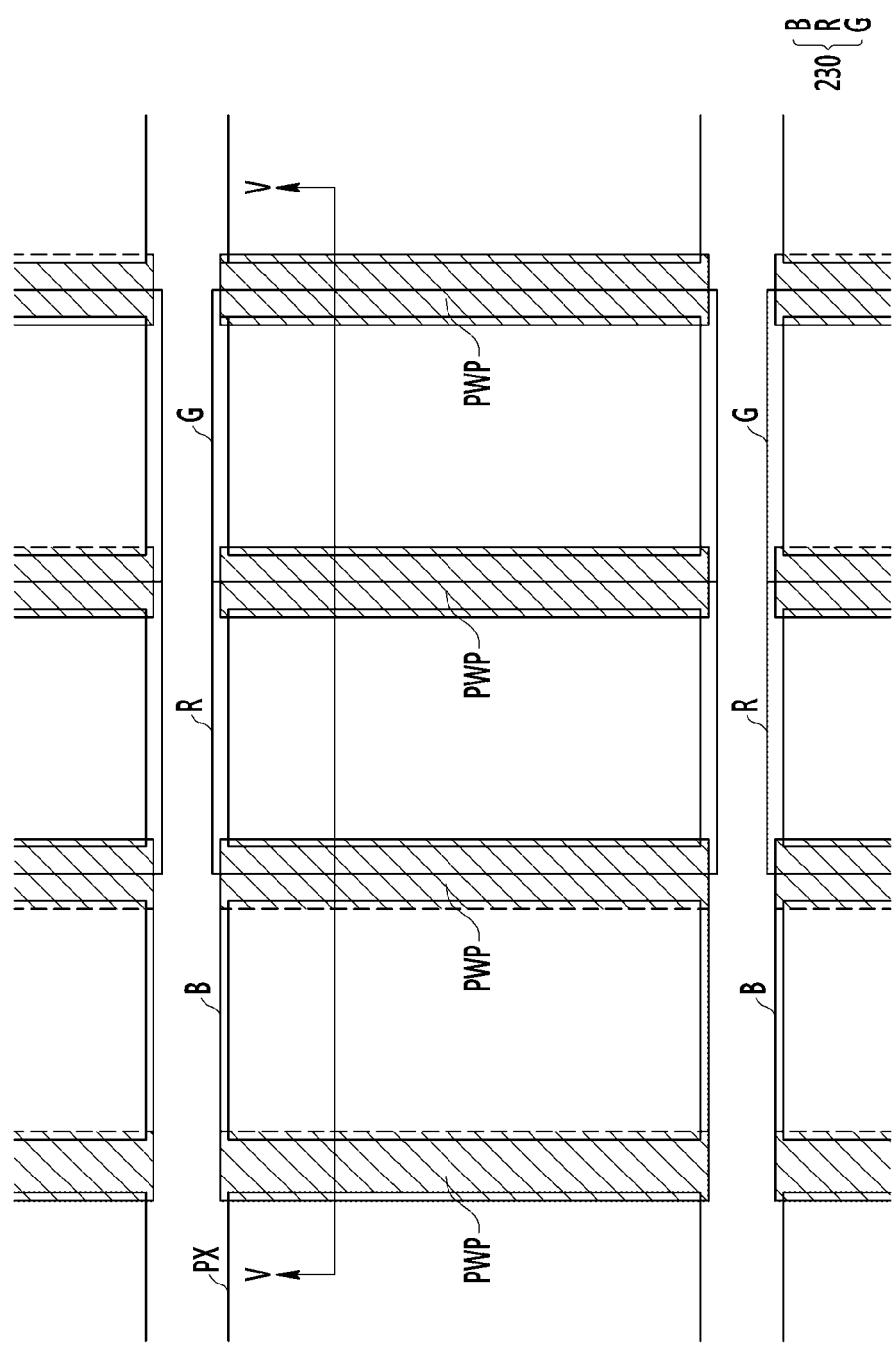
FIG. 4 is a top plan view of a color filter and a partition portion in a liquid crystal display according to an exemplary embodiment.

FIG. 4 is a top plan view of a color filter and a partition portion in a liquid crystal display according to an exemplary embodiment. FIG. 5 is a cross-sectional view of the color filter and the partition portion in the liquid crystal display taken along a line VAT of FIG. 4. FIG. 4 and FIG. 5 are views to schematically explain the color filter and the partition portion in the liquid crystal display according to an exemplary embodiment, and the constituent elements between the substrate 110 and the microcavity 305 may be applied with the description in FIG. 1 to FIG. 3 as it is.

Figure 5:
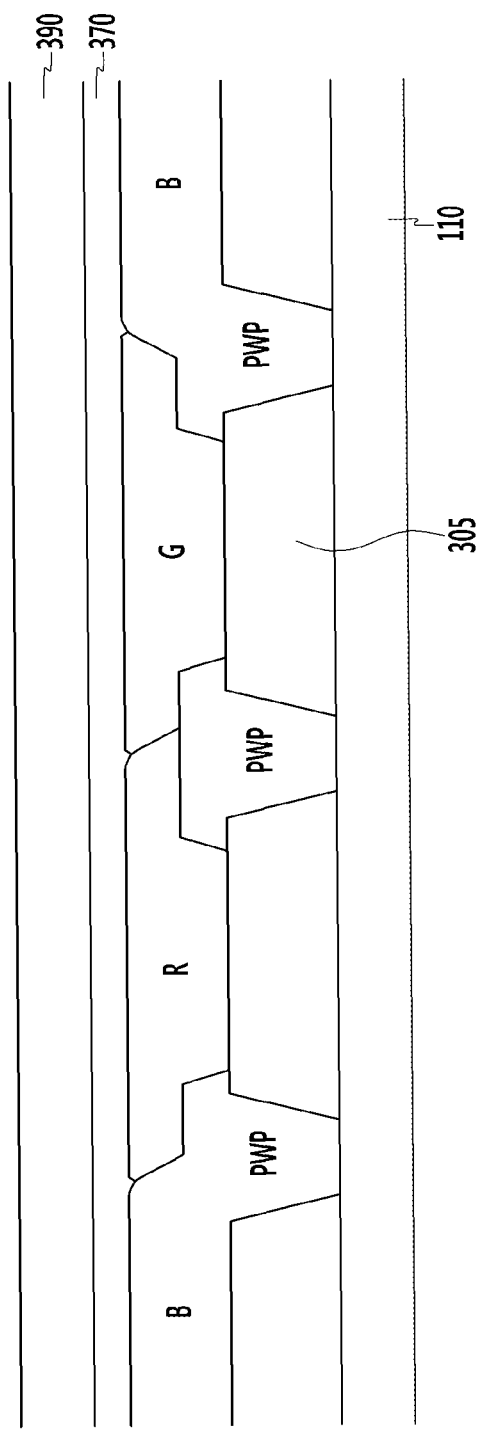
FIG. 5 is a cross-sectional view of the color filter and the partition portion in the liquid crystal display taken along a line V-V of FIG. 4.

Referring to FIG. 4 and FIG. 5, the color filter 230 according to the present exemplary embodiment includes a first color filter, a second color filter, and a third color filter. The first color filter may include a blue color filter B, the second color filter may include a red color filter R, and the third color filter may include a green color filter G.

According to the present exemplary embodiment, the partition portion PWP is formed by any one among the first color filter, the second color filter, and the third color filter. In an exemplary embodiment, the first color filter corresponding to the blue color filter B forms the partition portion PWP. The blue color filter B may include the partition portion PWP extended from the portion corresponding to the pixel area PX and the partition portion PWP disposed between the red color filter R and the green color filter G. In this case, the red color filter R and the green color filter G covering edges opposite to each other in the partition portions PWP are simultaneously adjacent to each other, and may overlap on the partition portion PWP.

Instead of the blue color filter B, it is possible to form the partition portion PWP made of the red color filter R or the green color filter G. However, the blue color filter B has a larger blocking effect compared with the red color filter R or the green color filter G such that there is a merit of reducing a reflection of the light if the partition portion PWP is formed of the blue color filter B. Also, the blue color filter B has excellent fluidity of a photoresist of the color filter as well as the light blocking effect, thereby obtaining a good taper angle. Accordingly, compared with a case that an end shape of the color filter forming the partition portion PWP is vertical, the end of the color filter is slanted with an angle of more than about 45 degrees, so the color filter coated on the partition portion PWP while covering the side wall of the partition portion PWP may be well formed.

As shown in FIG. 4, the color filter 230 may be formed of an island shape to correspond to the pixel area PX.

Again referring to FIG. 2 and FIG. 3, an upper insulating layer 370 is disposed on the color filter 230. The upper insulating layer 370 may be formed of the silicon nitride (SiNx) or the silicon oxide (SiOx). As shown in FIG. 2, the side surface of the color filter 230 may be covered.

A capping layer 390 is disposed on the upper insulating layer 370. The capping layer 390 is also disposed at the liquid crystal injection hole formation region 307FP and the liquid crystal injection hole 307 of the microcavity 305 exposed by the liquid crystal injection hole formation region 307FP. The capping layer 390 includes the organic material or the inorganic material. In the present exemplary embodiment, the liquid crystal material is removed in the liquid crystal injection hole formation region 307FP. But, in a modified exemplary embodiment, the liquid crystal material may remain at the liquid crystal injection hole formation region 307FP after being injected to the microcavity 305.

In the present exemplary embodiment, as shown in FIG. 3, the partition portion PWP formed by the color filter 230 of one color is formed between the microcavities 305 adjacent in the horizontal direction. The partition portion PWP may divide or define the microcavities 305 by forming a partition wall. In the present exemplary embodiment, since a partition wall structure such as the partition portion PWP, sometimes called the partition wall formation portion PWP, exists between the microcavities 305, even if the insulation substrate 110 is bent, generated stress is small, and a change degree of a cell gap may be considerably reduced.

Figure 6:
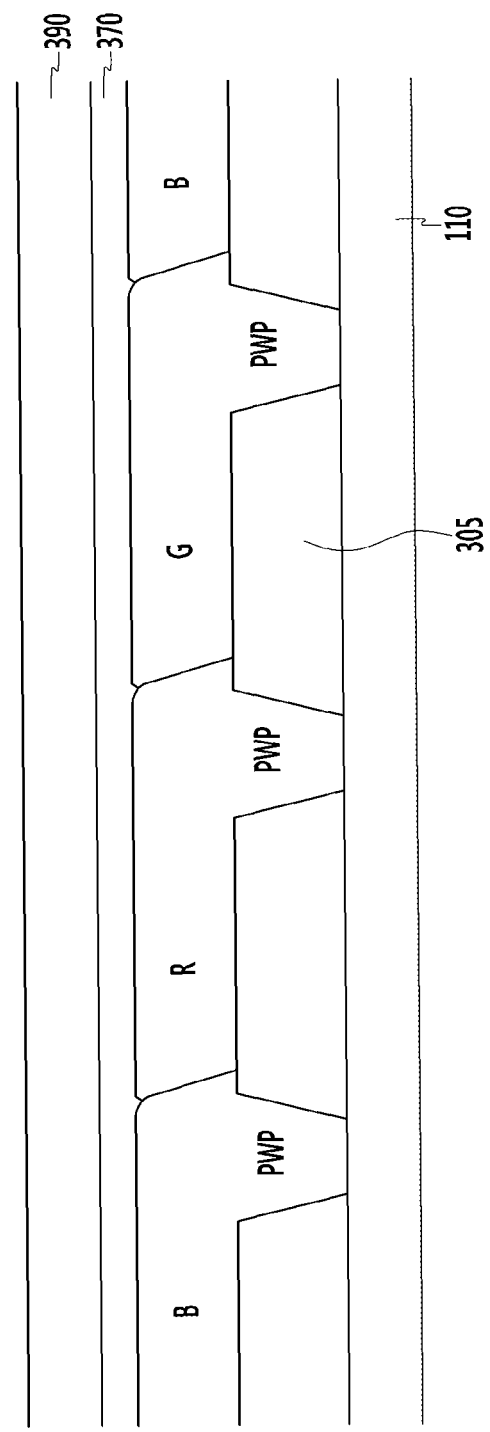
FIG. 6 is a cross-sectional view of a variation exemplary embodiment of the exemplary embodiment described in FIG. 5.

FIG. 6 is a cross-sectional view of a variation of a liquid crystal display according to an exemplary embodiment of FIG. 5.

Referring to FIG. 6, the liquid crystal display according to the present exemplary embodiment is the same as most of the exemplary embodiment of FIG. 5, however the color filter 230 near each partition portion PWP extends thereby forming the partition portion PWP. As shown in FIG. 6, two color filters 230 are close to one partition portion PWP, and each color filter B, R, and G extends in the same direction thereby forming the partition portion PWP. More particularly, the partition portion PWP disposed between the blue color filter B and the red color filter R may be formed by extending the blue color filter B, the partition portion PWP disposed between the red color filter R and the green color filter G may be formed by extending the red color filter R, and the partition portion PWP disposed between the green color filter G and the blue color filter B may be formed by extending the green color filter G. The color filters 230 neighboring each other have the boundaries at the position out of the partition portion PWP. However, the color filters 230 have portions thereof that overlap on the partition portion PWP. The color filters 230 may have boundaries at the portion deviated from the partition portion PWP.

However, it is not limited to this exemplary embodiment, and the partition portion PWP disposed between the blue color filter B and the red color filter R may be formed by extending the red color filter R, or the partition portion PWP disposed between the red color filter R and the green color filter G may be formed by extending the green color filter G.

The description of FIG. 5 except for the above-described differences may be applied to the present exemplary embodiment.

Figure 7:
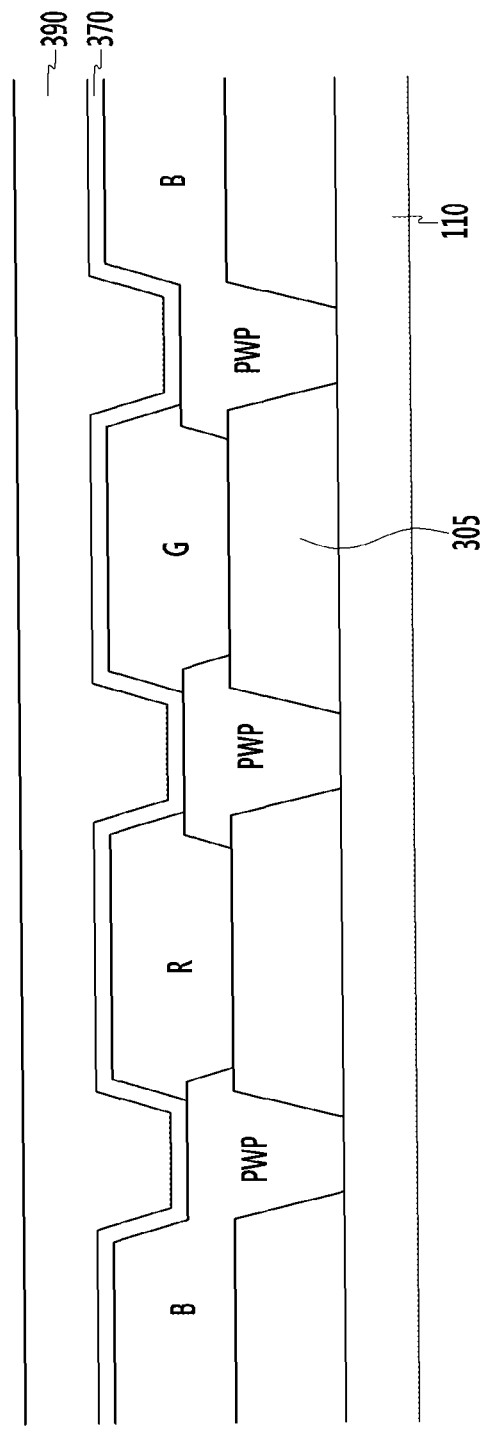
FIG. 7 is a cross-sectional view of a variation exemplary embodiment of the exemplary embodiment described in FIG. 5.

FIG. 7 is a cross-sectional view of a variation exemplary embodiment of the exemplary embodiment described in FIG. 5.

Referring to FIG. 7, the present exemplary embodiment is the same as most of the exemplary embodiment described in FIG. 5, however the color filters 230 adjacent to each other are separated on the partition portion PWP. This separation space is covered by the upper insulating layer 370 and the capping layer 390 disposed on the color filter 230.

The description of FIG. 5 except for the above described differences may be applied to the present exemplary embodiment.

Figure 8:
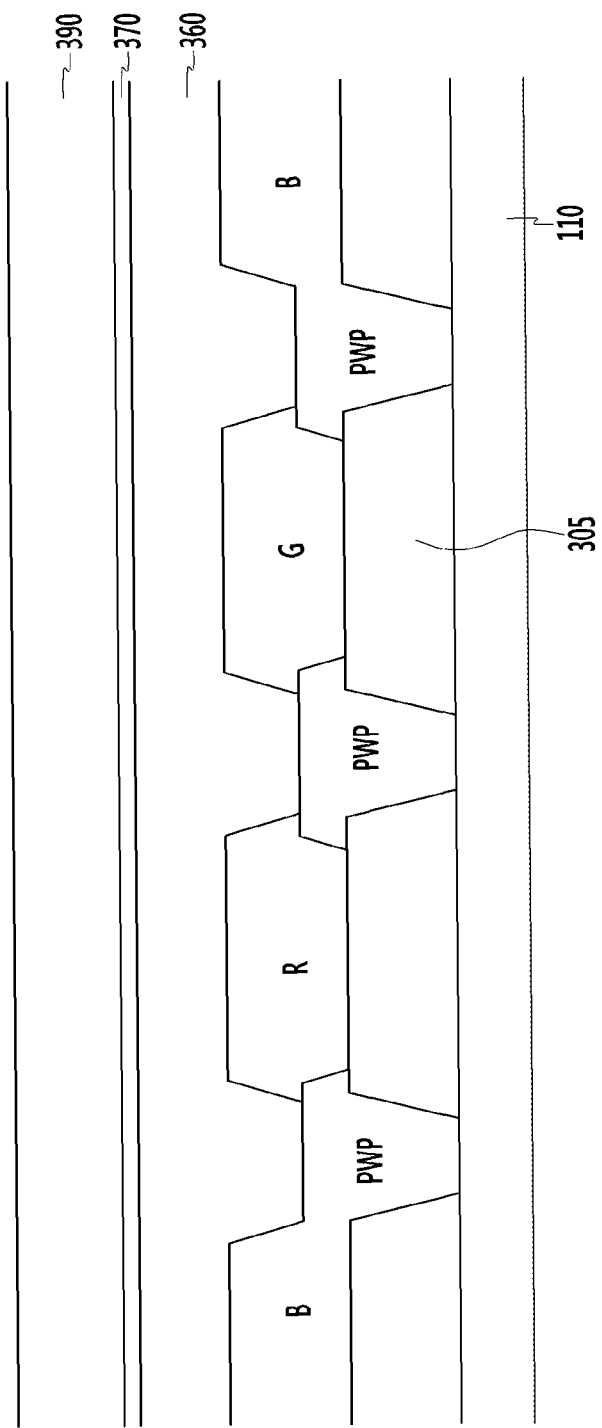
FIG. 8 is a cross-sectional view of a variation exemplary embodiment of the exemplary embodiment described in FIG. 5.

FIG. 8 is a cross-sectional view of a variation exemplary embodiment of the exemplary embodiment described in FIG. 5.

Referring to FIG. 8, the present exemplary embodiment is the same as most of the exemplary embodiment described in FIG. 5, however the color filters 230 adjacent to each other are separated on the partition portion MAT. This separation space may be filled with an organic layer 360 disposed on the color filter 230. The organic layer 360 may be the planarization layer, and reduces the step between the adjacent color filters 230 such that the capping deterioration of the upper insulating layer 370 formed on the organic layer 360 may be prevented.

The description of FIG. 5 except for the above-described differences may be applied to the present exemplary embodiment.

Figure 9:
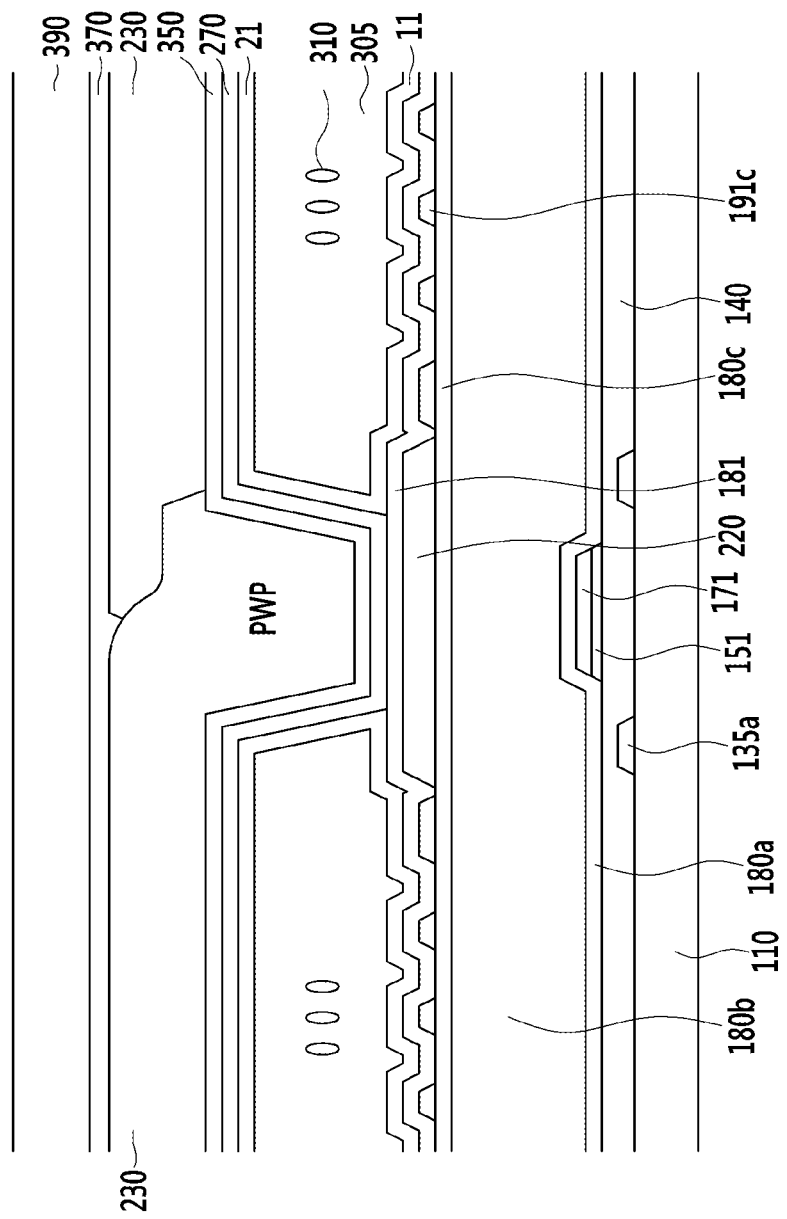
FIG. 9 is a cross-sectional view of a variation exemplary embodiment of the exemplary embodiment described in FIG. 3.

FIG. 9 is a cross-sectional view of a variation exemplary embodiment of the exemplary embodiment described in FIG. 3.

Referring to FIG. 9, the present exemplary embodiment is the same as most of the exemplary embodiment described in FIG. 3, however the light blocking member 220 is formed along the direction that the data line 171 extends. The light blocking member 220 is disposed on the third interlayer insulating layer 180c or the pixel electrode 191. The light blocking member 220 that is described here may be formed of a lattice shape along with the light blocking member 220 that is extended in the direction of the gate line 121.

Figure 10:
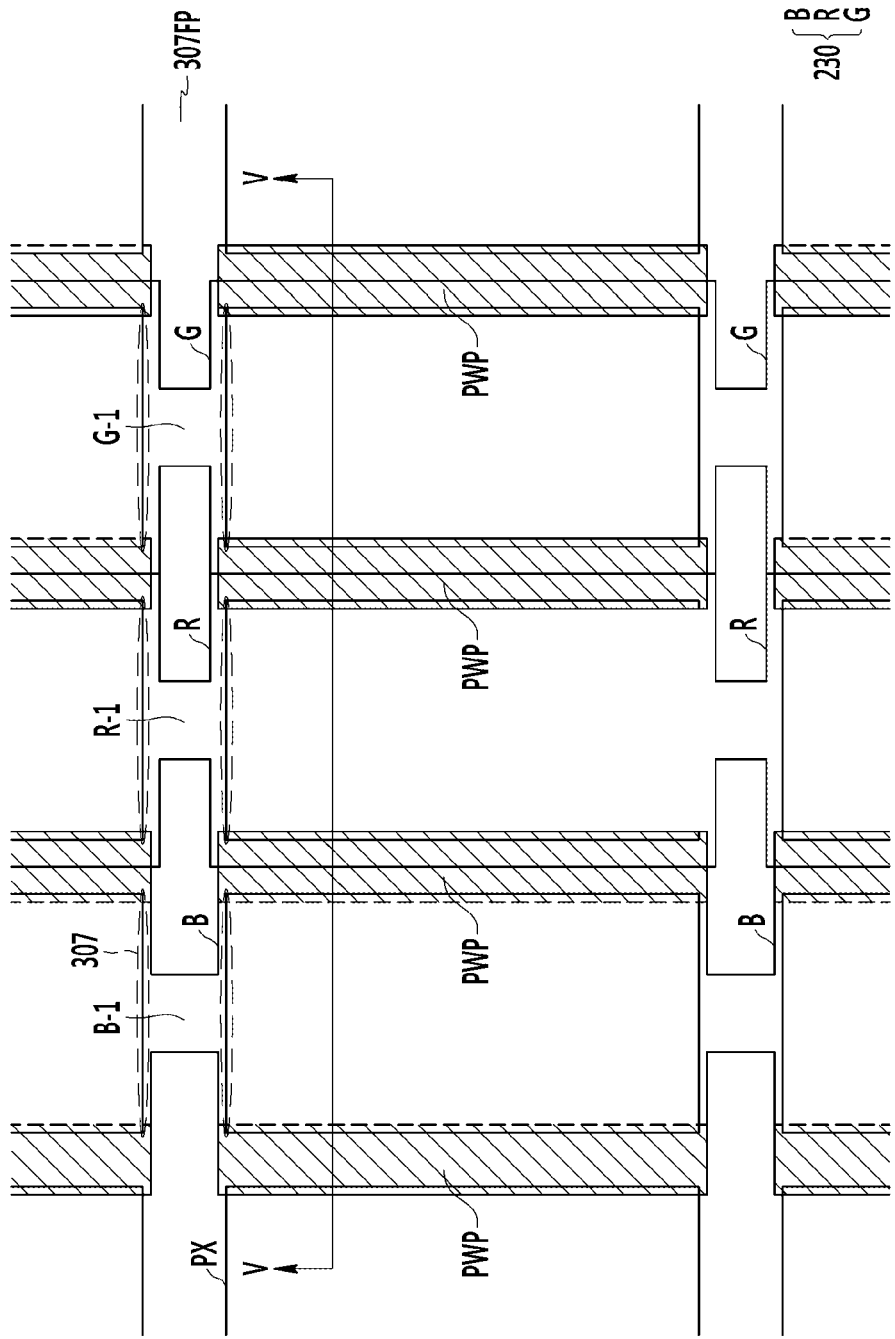
FIG. 10 is a top plan view of a variation exemplary embodiment of the exemplary embodiment described in FIG. 4.

FIG. 10 is a top plan view of a variation exemplary embodiment of the exemplary embodiment described in FIG. 4.

The exemplary embodiment described in FIG. 10 is the same as most of the exemplary embodiment described in FIG. 4. However, in the exemplary embodiment described in FIG. 4, the color filters that are vertically adjacent to each other are formed of the island shape to be disposed and divided in the pixel area PX. In contrast, the color filters that are vertically adjacent to each other may include a connection in the exemplary embodiment of FIG. 10. For example, the blue color filters B are not divided vertically, but may be connected by a first connection B-1 in the vertical direction. The red color filter R and the green color filter G may be respectively connected by a second connection R-1 and a third connection G-1 in the vertical direction.

If sizes of the first connection B-1, the second connection R-1, and the third connection G-1 are increased, the area of the liquid crystal injection hole formation region 307FP may be reduced. Accordingly, the size and the position of the connections B-1, R-1, and G-1 may be adjusted such that the alignment material and the liquid crystal material are freely injected into the microcavity 305 through the liquid crystal injection hole 307.

Figure 11:
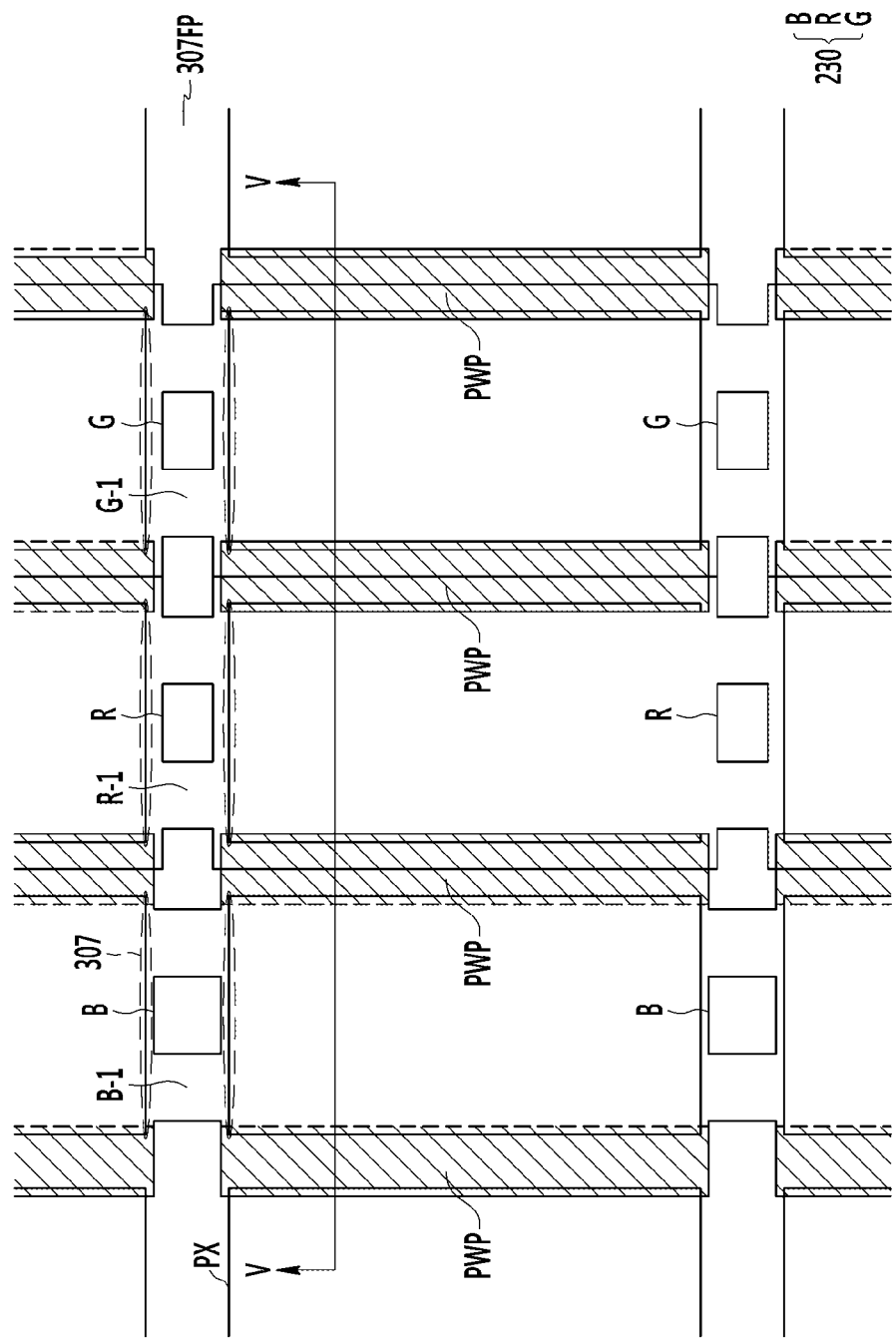
FIG. 11 is a top plan view of a variation exemplary embodiment of the exemplary embodiment described in FIG. 10.

FIG. 11 is a top plan view of a variation exemplary embodiment of the exemplary embodiment described in FIG. 10.

The exemplary embodiment described in FIG. 11 is the same as most of the exemplary embodiment described in FIG. 10. However, in the exemplary embodiment described in FIG. 10, the connection of the color filters that are adjacent vertically is disposed at the center with reference to a short edge of the pixel area PX. In contrast, the connection of the color filters that are adjacent vertically may be disposed at right and left edges with reference to the pixel area PX in the exemplary embodiment of FIG. 11.

A manufacturing method of a liquid crystal display according to an exemplary embodiment will now be described with reference to FIGS. 12 to 30. The below exemplary embodiment is an exemplary embodiment of the manufacturing method and may be varied.

Figure 18:
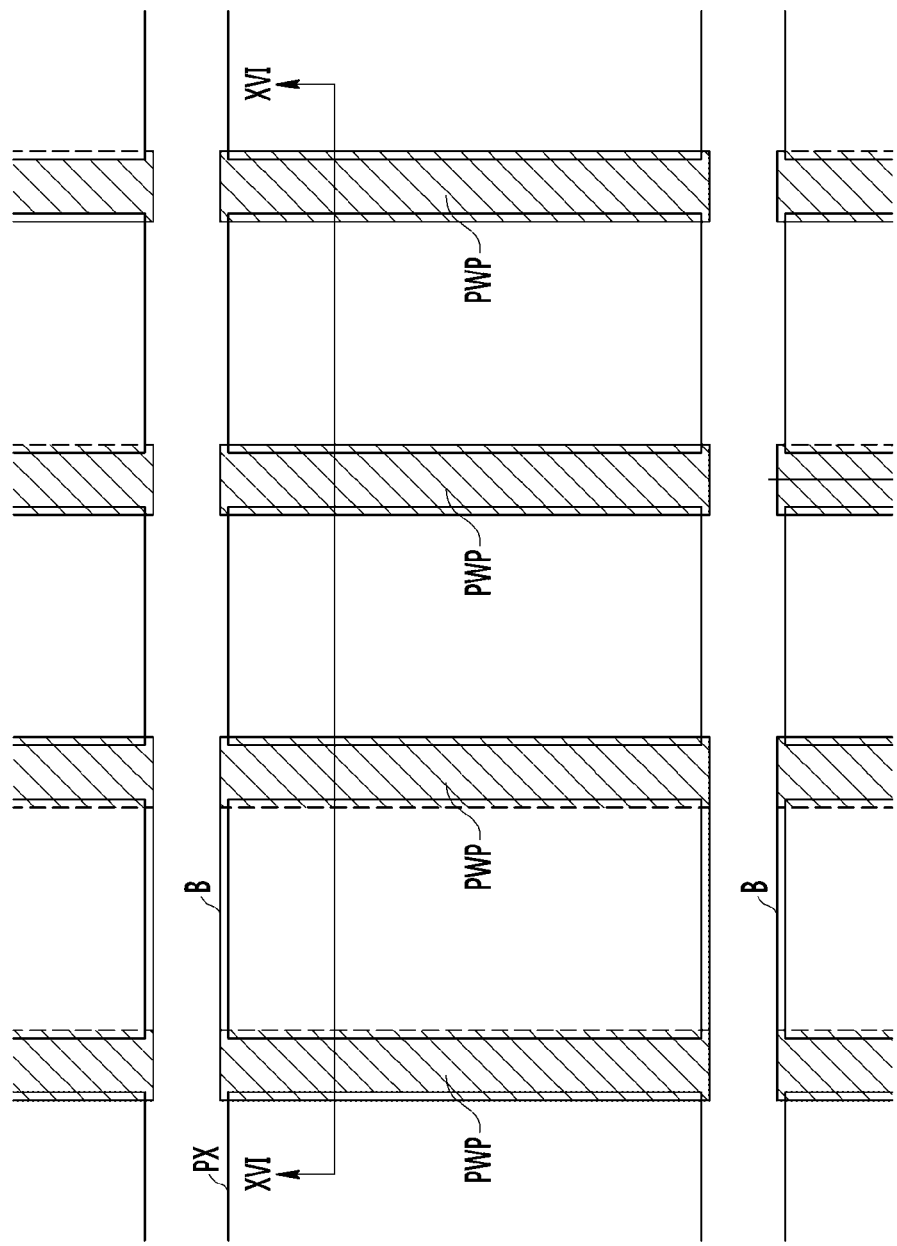
Figure 19:
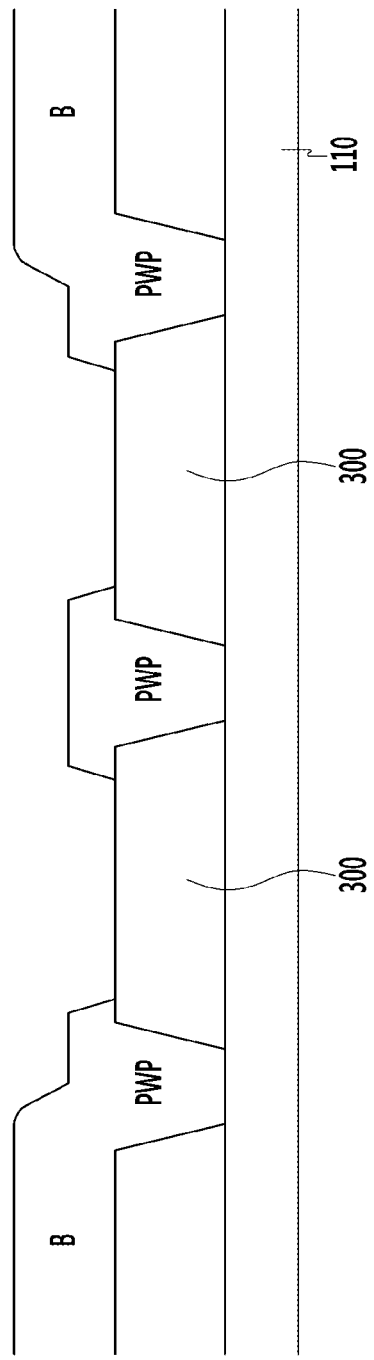
Figure 20:
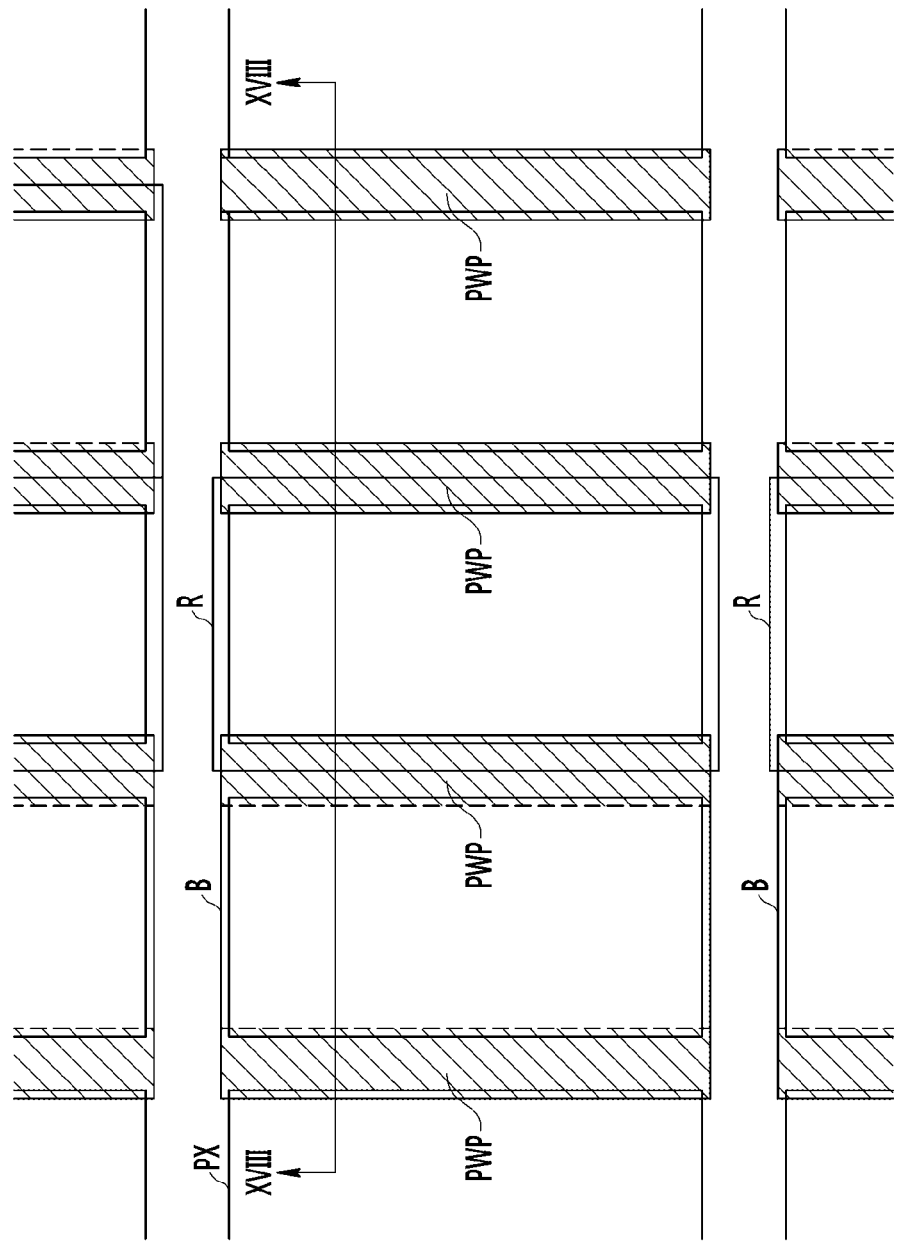
Figure 21:
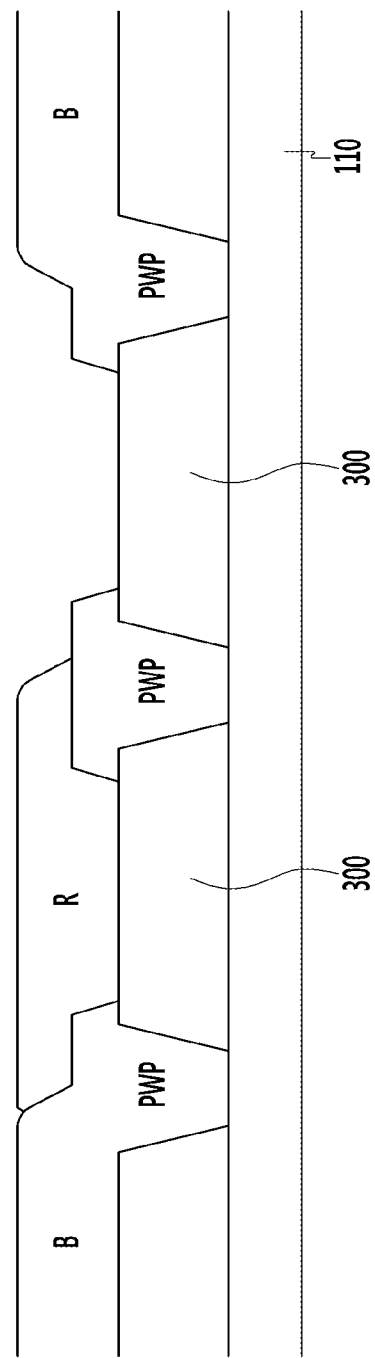
Figure 22:
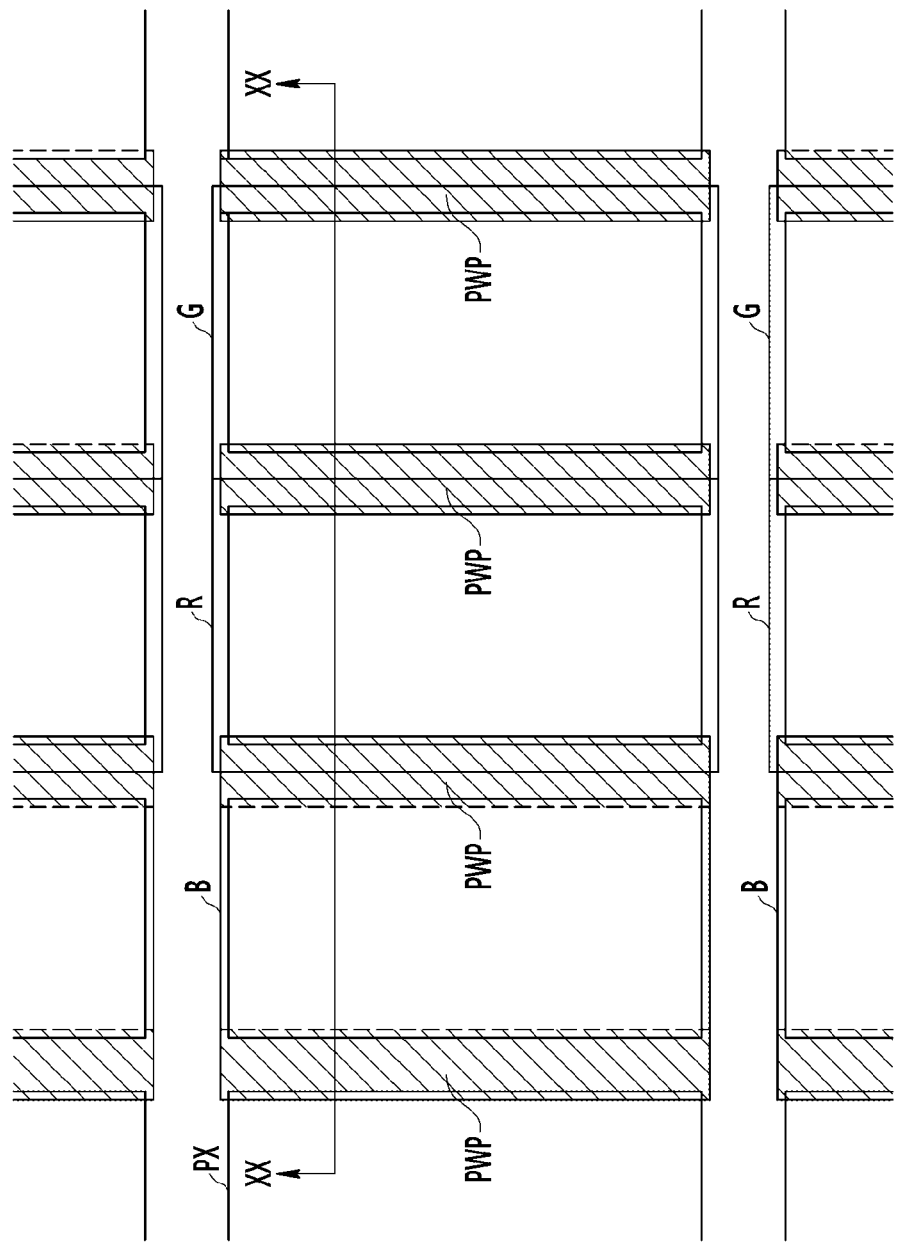
Figure 23:
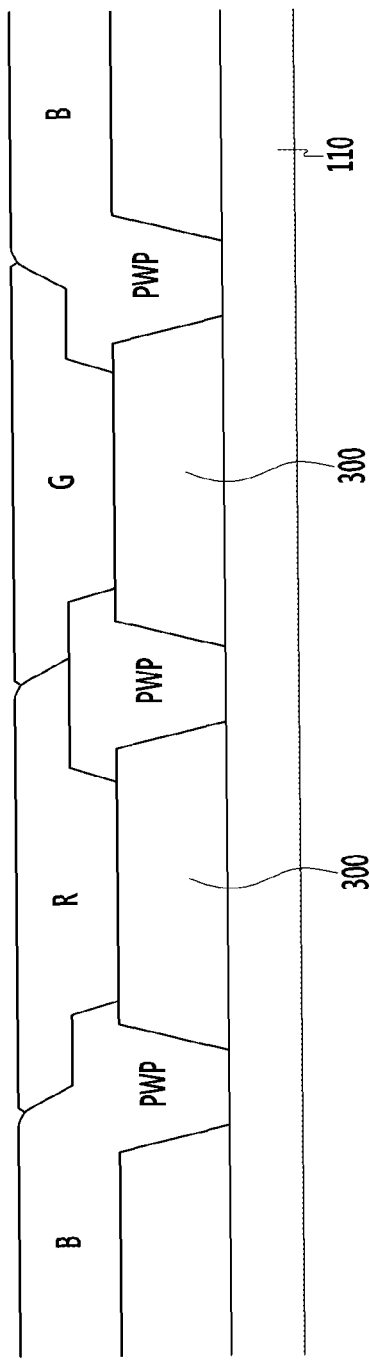

FIGS. 12 to 30 are top plan views and cross-sectional views showing a manufacturing method of a liquid crystal display according to an exemplary embodiment. FIGS. 12, 14, 16, 24, 26, 27, and 29 sequentially show the cross-sectional views taken along the line II-II of FIG. 1. FIGS. 13, 15, 17, 25, 28, and 30 sequentially show the cross-sectional views taken along the line III-III of FIG. 1. FIGS. 18, 20, and 22 are top plan views of a color filter and a partition portion in the manufacturing method of the liquid crystal display according to an exemplary embodiment. FIGS. 19, 21, and 23 are cross-sectional views taken along a line XVI-XVI of FIG. 18, a line XVIII-XVIII of FIG. 20, and a line XX-XX of FIG. 22, respectively.

Figure 12:
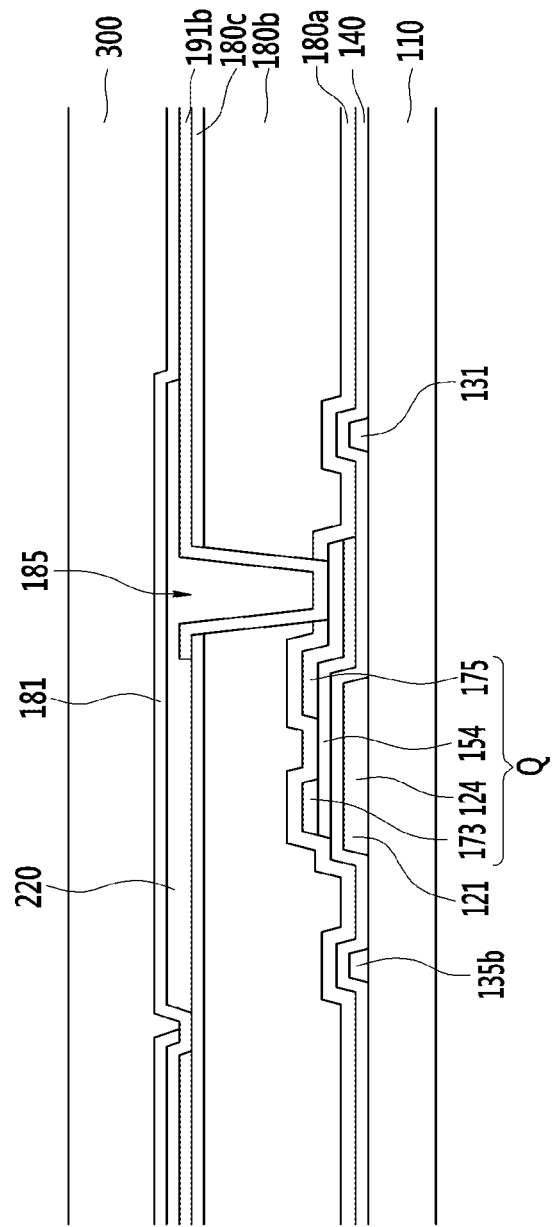
FIGS. 12, 13, 14, 15, 16, 17, 18, 19, 20, 21, 22, 23, 24, 25, 26, 27, 28, 29, and 30 are top plan views and cross-sectional views showing a manufacturing method of a liquid crystal display according to an exemplary embodiment.
Figure 13:
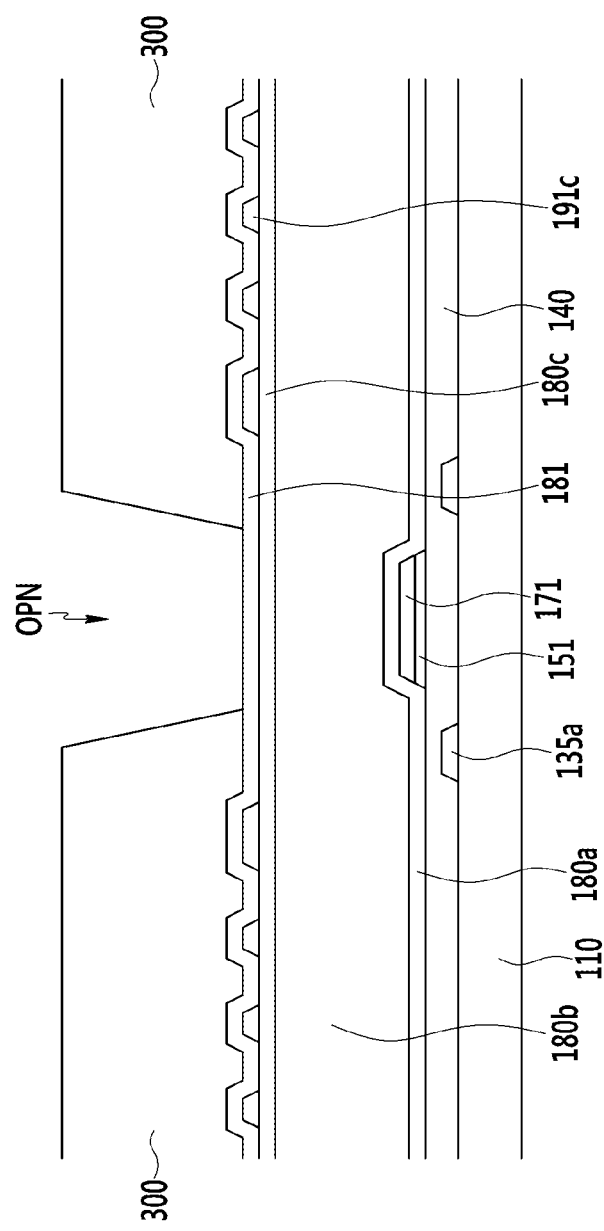

Referring to FIG. 1, FIG. 12, and FIG. 13, to form a generally known switching element on a substrate 110, a gate line 121 extending in a horizontal direction and a gate insulating layer 140 on the gate line 121 are formed, semiconductor layers 151 and 154 are formed on the gate insulating layer 140, and a source electrode 173 and a drain electrode 175 are formed. At this time, the data line 171 connected to the source electrode 173 may be formed to extend in a vertical direction while crossing the gate line 121.

The first interlayer insulating layer 180a is formed on the data conductors 171, 173, and 175 including the source electrode 173, the drain electrode 175, and the data line 171, and the exposed portion of the semiconductor layer 154.

The second interlayer insulating layer 180b and the third interlayer insulating layer 180c are formed on the first interlayer insulating layer 180a and the contact hole 185 passing through them is formed. Next, the pixel electrode 191 is formed on the third interlayer insulating layer 180c, and the pixel electrode 191 may be electrically and physically connected to the drain electrode 175 through the contact hole 185.

The light blocking member 220 is formed on the pixel electrode 191 or the third interlayer insulating layer 180c. The light blocking member 220 may be formed according to the direction that the gate line 121 extends. The light blocking member 220 may be formed of the material blocking the light. The insulating layer 181 is formed on the light blocking member 220 and the insulating layer 181 may be extended on the pixel electrode 191 while covering the light blocking member 220.

Next, a sacrificial layer 300 is formed on the pixel electrode 191. In this case, an open portion OPN is formed along the direction parallel to the data line 171 in the sacrificial layer 300. In the open portion OPN, the color filter 230 may be filled in a following process thereby forming the partition portion PWP. The sacrificial layer 300 may be formed of a photoresist or the organic material.

Figure 14:
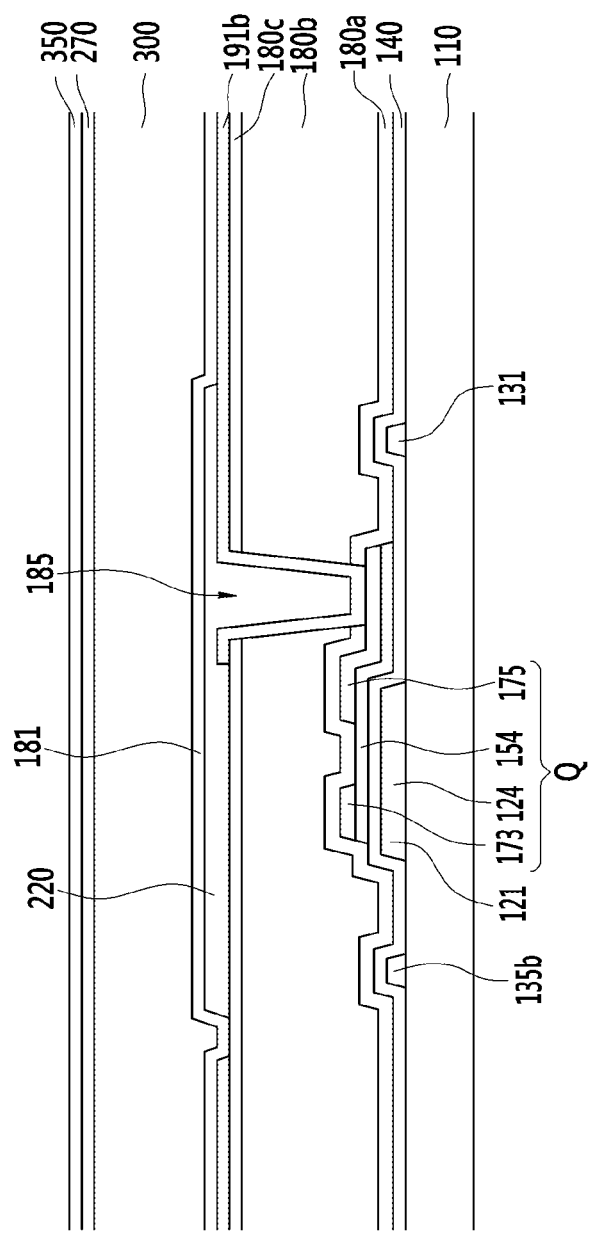
Figure 15:
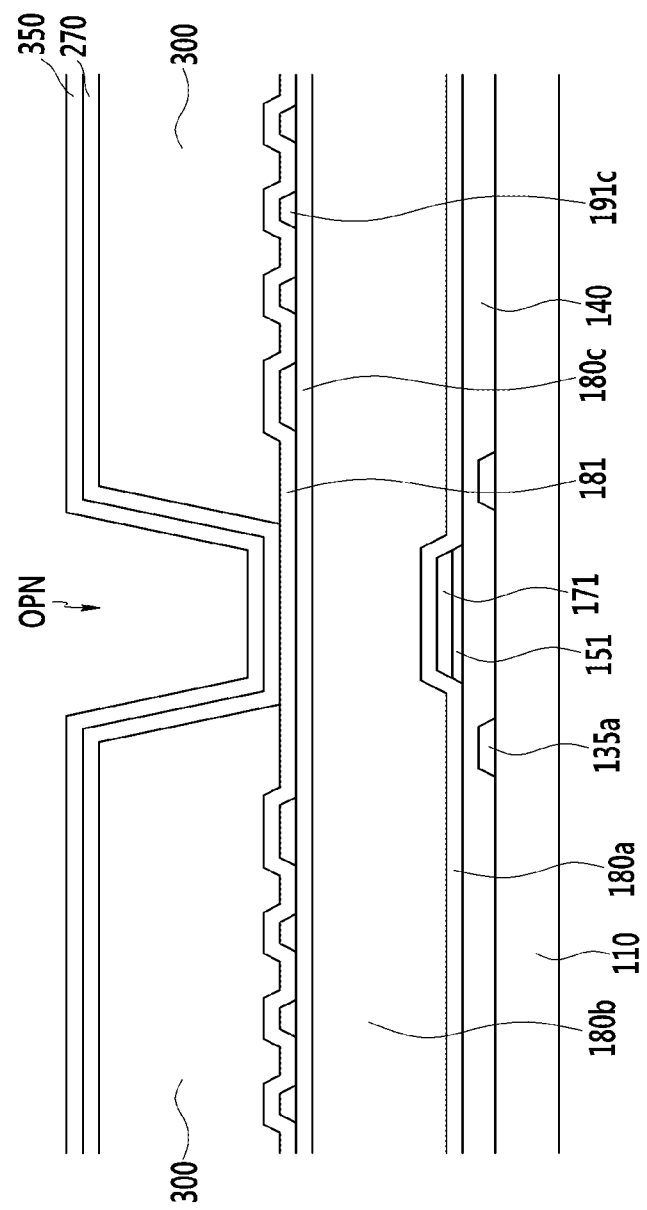

Referring to FIG. 1, FIG. 14, and FIG. 15, the common electrode 270 and the lower insulating layer 350 are sequentially formed on the sacrificial layer 300. As shown in FIG. 15, the common electrode 270 and the lower insulating layer 350 may cover the open portion OPN.

Figure 16:
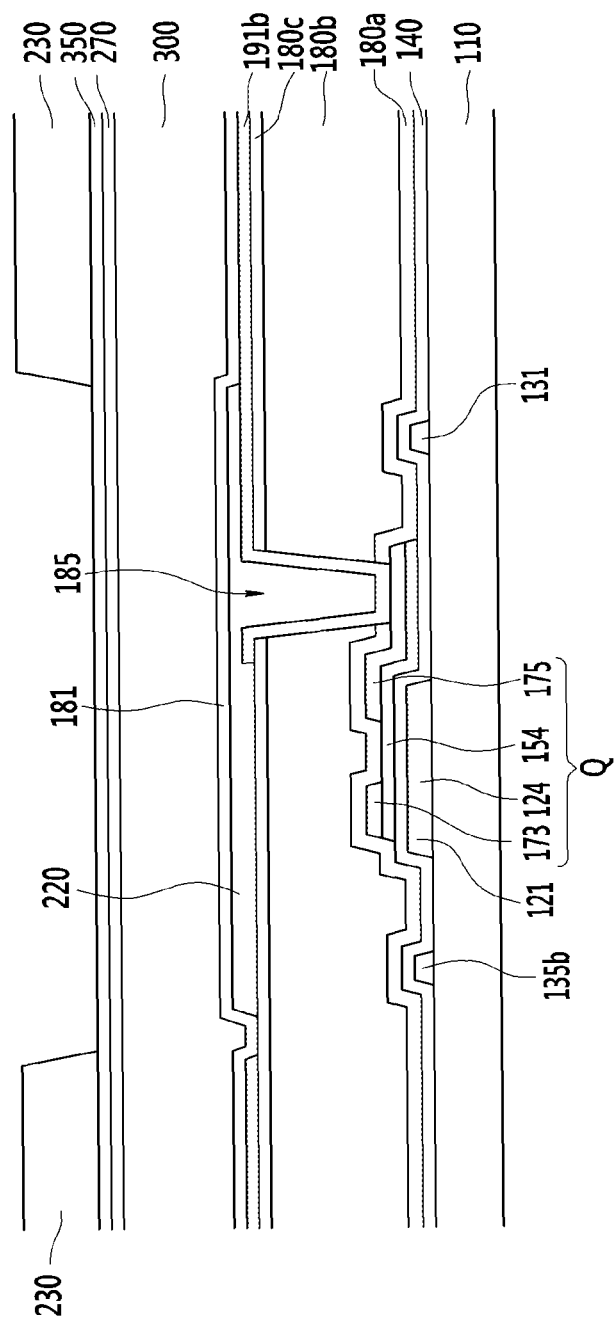
Figure 17:
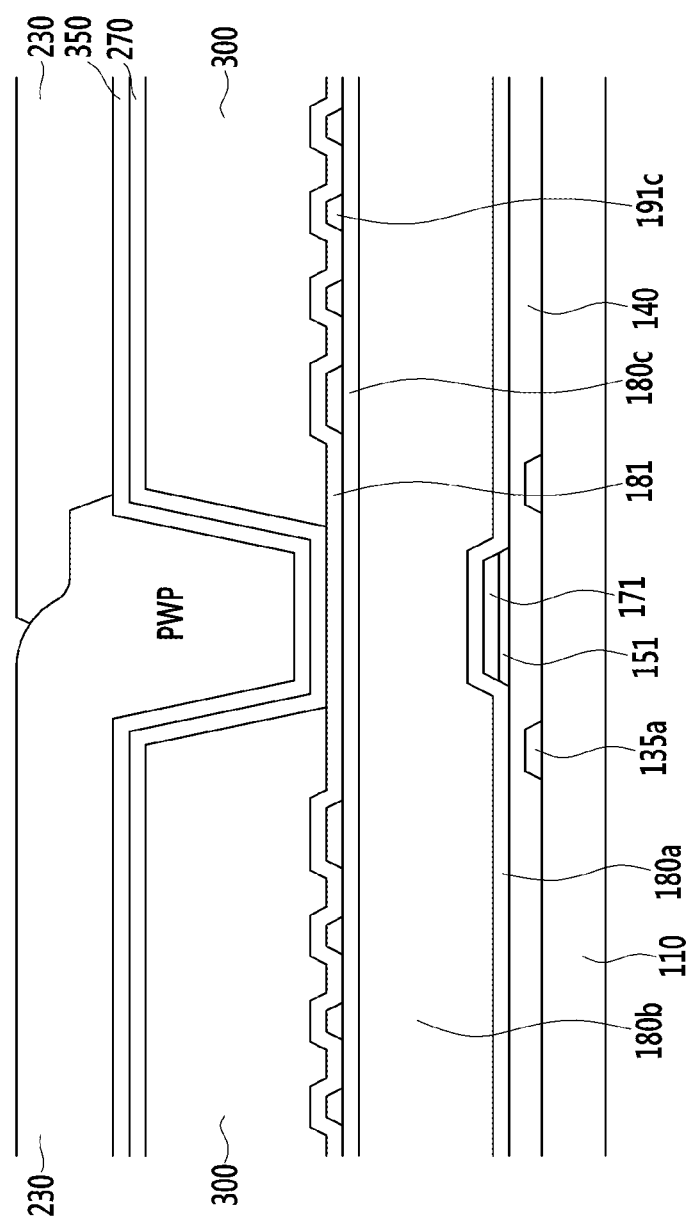

Referring to FIG. 1, FIG. 16, and FIG. 17, the color filter 230 is formed on the lower insulating layer 350. The color filter 230 may be removed in the region corresponding to the light blocking member 220 disposed between the pixel areas adjacent in the vertical direction by the patterning process or the exposure/developing process. As shown in FIG. 16, the color filter 230 exposes the lower insulating layer 350 outside in the region corresponding to the light blocking member 220. At this time, as shown in FIG. 17, the color filter 230 forms the partition portion PWP while filling the open portion OPN of the light blocking member 220. In the present exemplary embodiment, the color filter 230 filling the open portion OPN is the color filter 230 of one color. The color filters 230 neighboring the color filter 230 forming the partition portion PWP may overlap each other on the partition portion PWP. However, as the variation of the exemplary embodiment, the neighboring color filters 230 may be formed to be separated on the partition portion PWP.

Hereafter, the manufacturing process of the color filter 230 according to an exemplary embodiment will be described with reference to FIG. 18 to FIG. 23.

Referring to FIG. 18 and FIG. 19, the blue color filter B is formed on the sacrificial layer 300. In this case, the blue color filter B is formed to fill the separation space between the sacrificial layers 300 separated in the horizontal direction. The blue color filter B is formed at the portion corresponding to the pixel area PX, and the blue color filter B formed corresponding to the pixel area PX extends thereby forming the partition portion PWP. Also, the partition portion PWP is only formed to be separated between two pixel areas PX where the blue color filter B is not formed. It is preferable that the partition portion PWP separated from the partition portion PWP formed by extending the blue color filter B is formed by using one mask. However, to form the structure described in FIG. 6, the blue color filter B may be formed to form the portion corresponding to the pixel area PX and the partition portion PWP extended therefrom, and the partition portion may not be formed in the separation space between two pixel areas PX where the blue color filter B is formed. The separation space between the sacrificial layer 300 that is filled by the color filter 230 may be filled with the partition portion in the following process of forming the red color filter R or the green color filter G.

Referring to FIG. 20 and FIG. 21, the red color filter R is formed on the sacrificial layer 300. The red color filter R is formed to overlap the partition portion PWP, and may overlap on the blue color filter B and the partition portion PWP.

Referring to FIG. 22 and FIG. 23, the green color filter G is formed on the sacrificial layer 300. The green color filter G is formed to overlap the partition portion PWP, and may respectively overlap the blue color filter B and the red color filter R on the partition portion PWP.

The formation position and the sequence of the above-described red color filter R and green color filter G may be changed. Also, differently from that shown in FIG. 23, the thicknesses of the blue color filter B, the red color filter R, and the green color filter G may be different. The reason for differentiating the thicknesses of the blue color filter B, the red color filter R, and the green color filter G is to adjust color coordinates in each color filter. Also, the heights of the blue color filter B, the red color filter R, and the green color filter G may be different. To differentiate the height of each color filter, the thickness of the sacrificial layer 300 corresponding to each color filter R, G and B may be changed. Next, if the sacrificial layer 300 is removed, the microcavities 305 having the different heights may be formed, and the heights of each color filter disposed thereon may be different.

Figure 24:
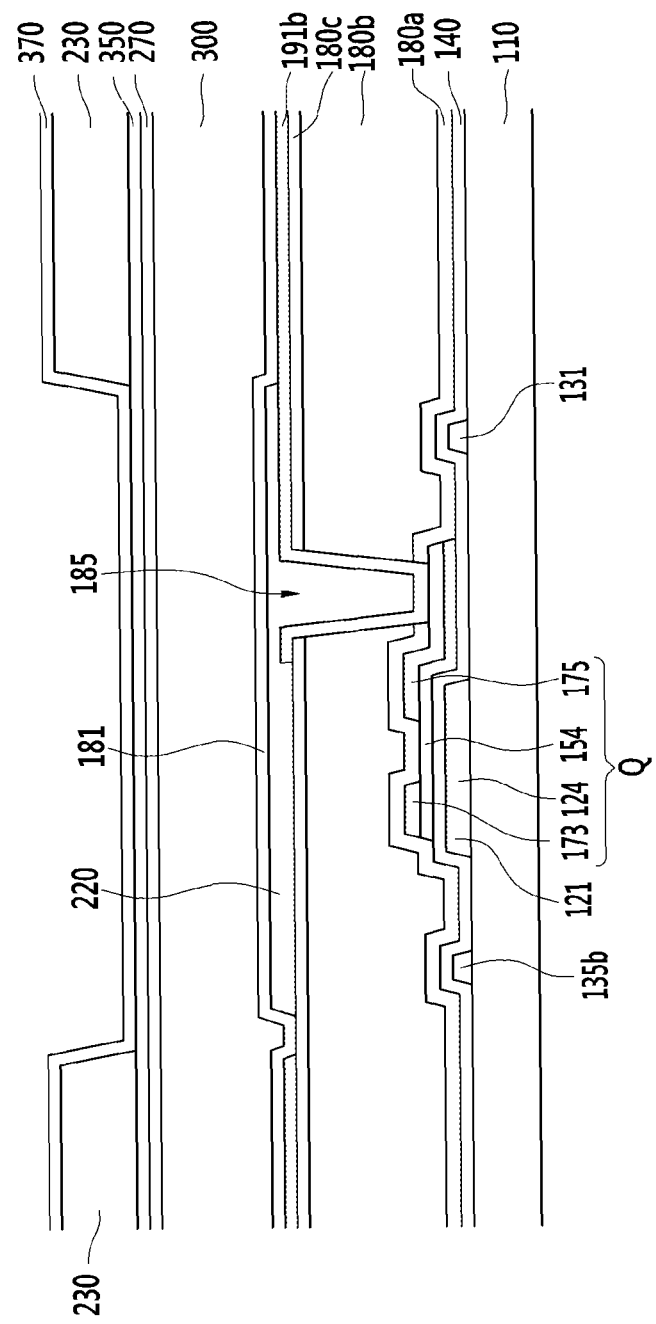
Figure 25:
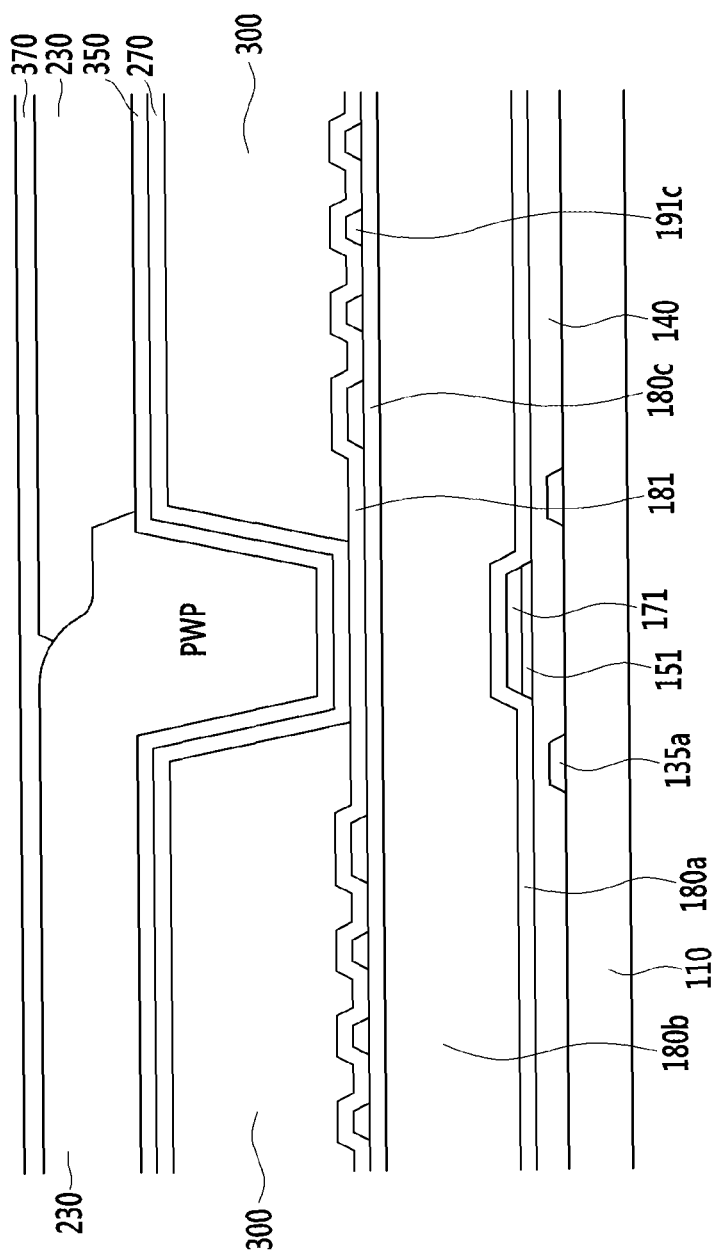

Next, referring to FIG. 1, FIG. 24, and FIG. 25, the upper insulating layer 370 covering the color filter 230 and the exposed lower insulating layer 350 is formed.

Figure 26:
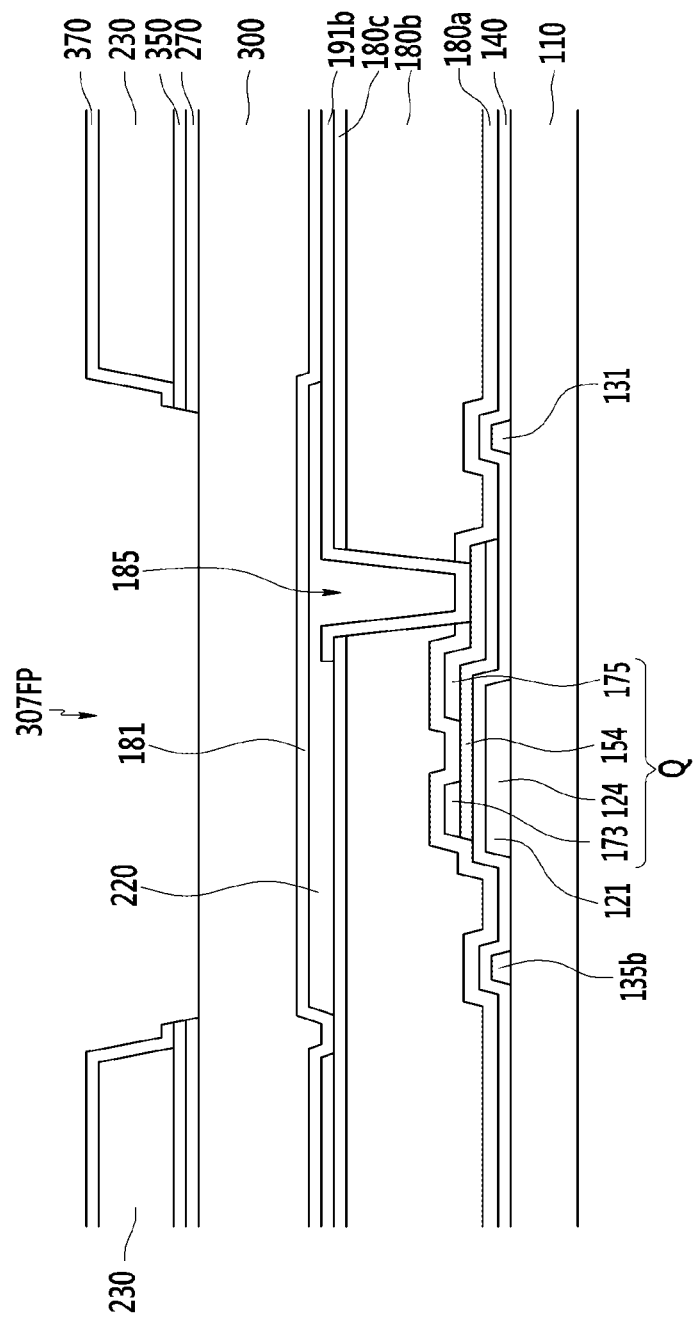

Referring to FIG. 26, the upper insulating layer 370, the lower insulating layer 350, and the common electrode 270 are etched to partially remove the upper insulating layer 370, the lower insulating layer 350, and the common electrode 270, and to form the liquid crystal injection hole formation region 307FP. In this case, the upper insulating layer 370 has a structure covering the side surface of the color filter 230, however it is not limited thereto, and the upper insulating layer 370 covering the side surface of the color filter 230 may be removed to expose the side surface of the color filter 230 outside.

Figure 27:
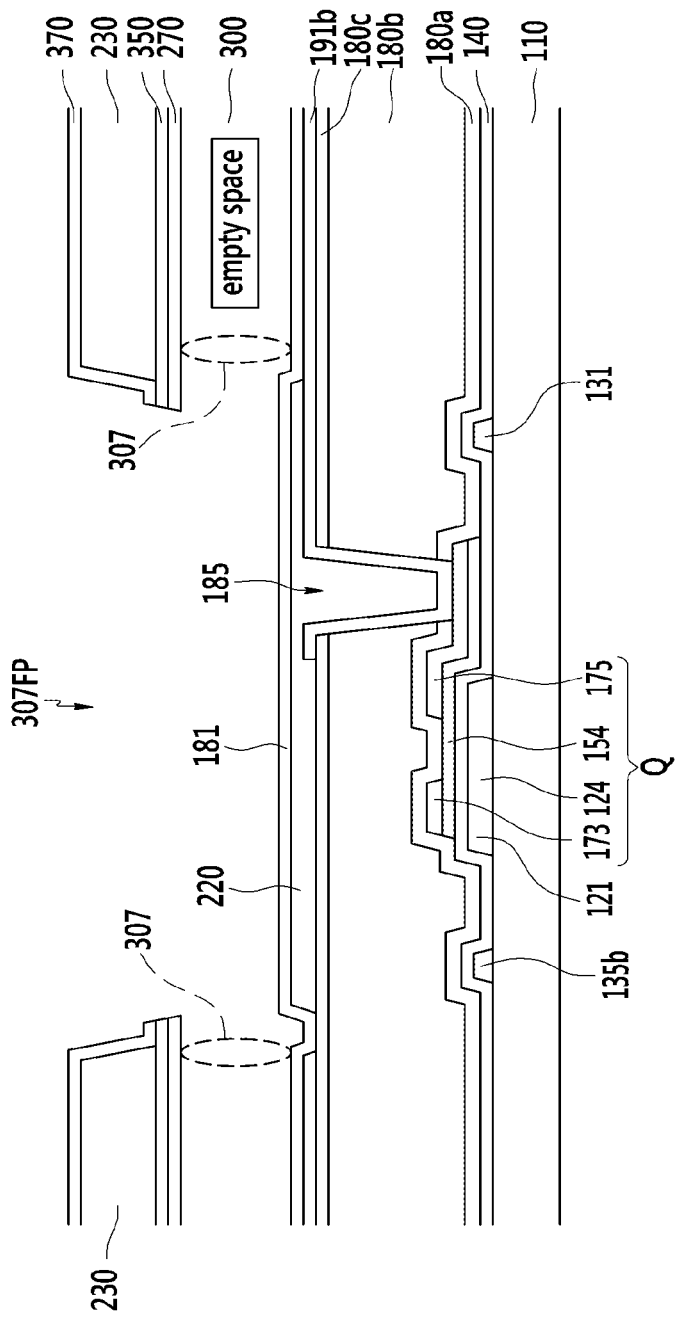
Figure 28:
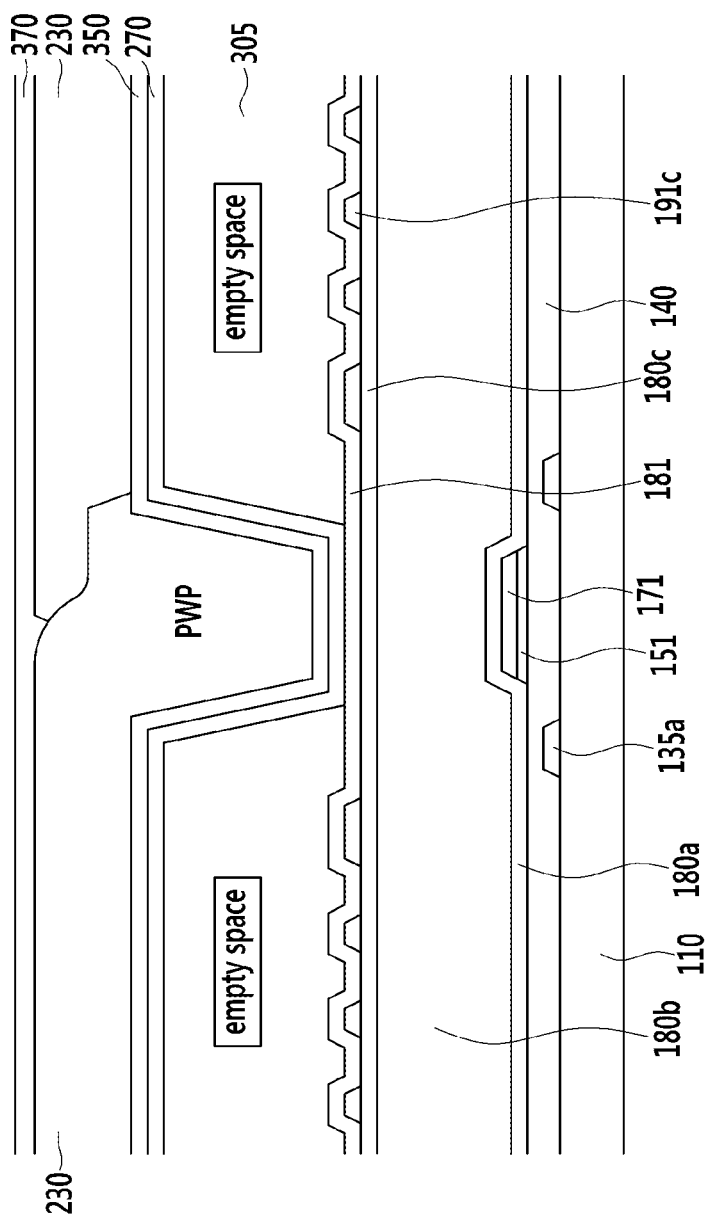

Referring to FIG. 27 and FIG. 28, the sacrificial layer 300 is removed through the liquid crystal injection hole formation region 307FP by oxygen (02) ashing treatment or a wet etching method. At this time, the microcavity 305 having the liquid crystal injection hole 307 is formed. The microcavity 305 is an empty space formed when the sacrificial layer 300 is removed.

Figure 29:
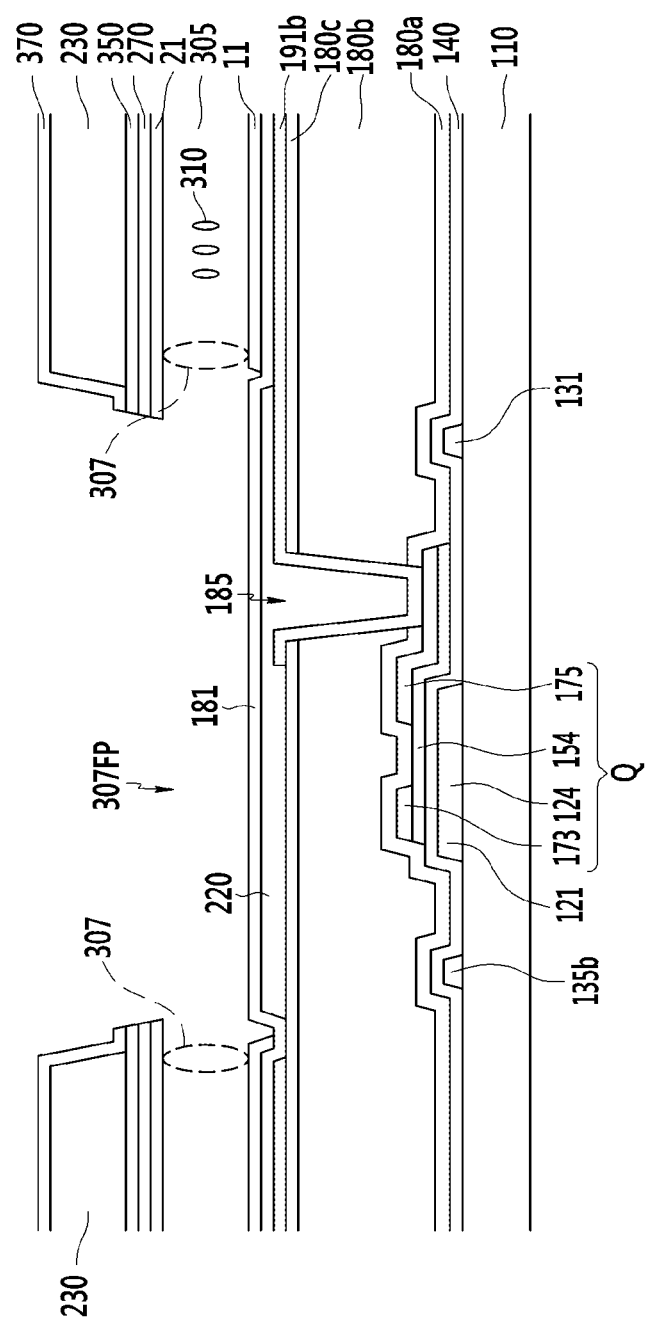
Figure 30:
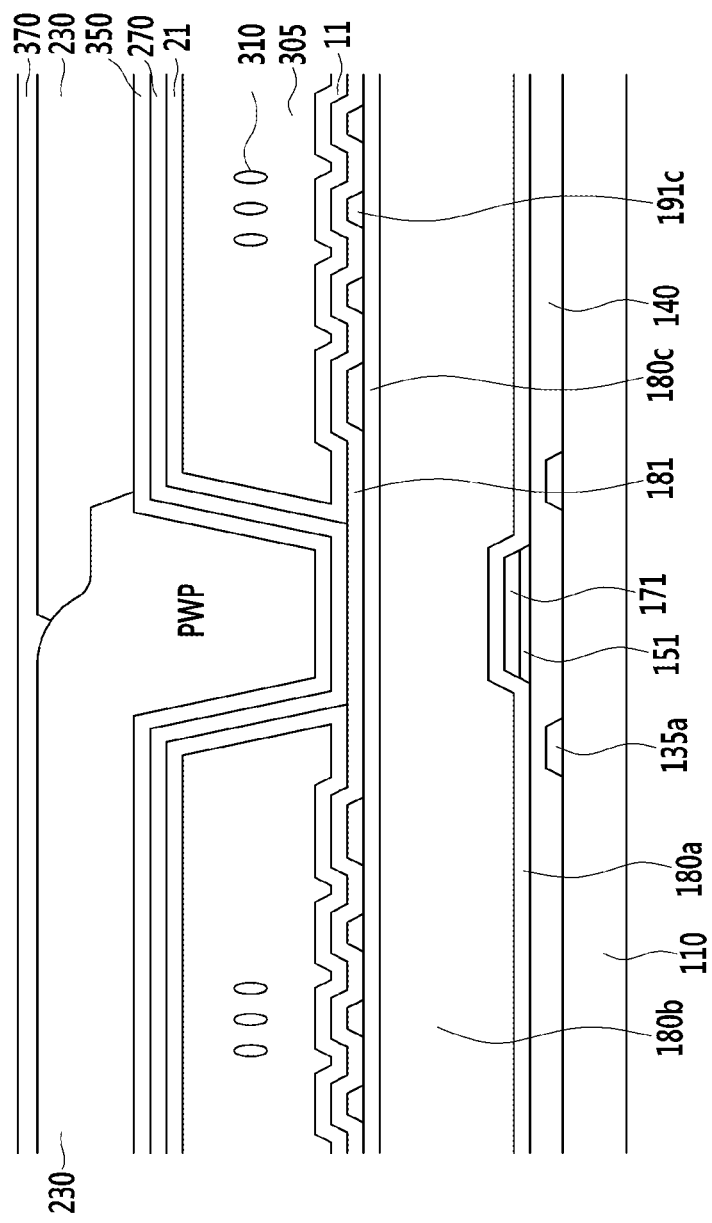

Referring to FIG. 29 and FIG. 30, the alignment material is injected through the liquid crystal injection hole 307 to form the alignment layers 11 and 21 on the pixel electrode 191 and the common electrode 270. In detail, a bake process is performed after injecting an alignment material including a solid content and a solvent through the liquid crystal injection hole 307.

Next, a liquid crystal material including the liquid crystal molecules 310 is injected into the microcavity 305 via the liquid crystal injection hole 307, using an inkjet method and the like.

Thereafter, the capping layer 390 is formed on the insulating layer 350 to cover the liquid crystal injection hole 307 and the liquid crystal injection hole formation region 307FP to form the liquid crystal display illustrated in FIG. 2.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

<Description of Symbols>

| 230 | color filter | 300 | sacrificial layer |
|---|---|---|---|
| 305 | microcavity | 307 | liquid crystal injection hole |
| 350 | lower insulating layer | 370 | upper insulating layer |
| 390 | capping layer | | |

What is claimed is:

1. A method for manufacturing a liquid crystal display, comprising:
   forming a thin film transistor on a substrate;
   forming a pixel electrode connected to the thin film transistor;
   forming a sacrificial layer with an open portion on the pixel electrode;
   forming a first color filter on the sacrificial layer;
   forming a second color filter on the sacrificial layer;
   forming a third color filter on the sacrificial layer;
   removing the sacrificial layer to form a plurality of microcavities;
   injecting a liquid crystal material into the microcavities;
   forming a capping layer to cover a liquid crystal injection hole of the microcavities; and filling the open portion with one color filter among the first color filter, the second color filter, and the third color filter.

2. The method of claim 1, wherein
the color filter filling the open portion forms the partition portion, and the partition portion defines the microcavities.

3. The method of claim 2, wherein
the partition portion is formed along a direction that the data line connected to the thin film transistor extends.

4. The method of claim 3, wherein
the first color filter, the second color filter, and the third color filter are formed of an island shape.

5. The method of claim 4, further comprising
forming a lower insulating layer on the sacrificial layer.

6. The method of claim 5, wherein
a boundary surface in which color filters neighboring each other among the first color filter, the second color filter, and the third color filter meet each other is disposed on the partition portion.

7. The method of claim 5, wherein
a separation space of color filters neighboring each other among the first color filter, the second color filter, and the third color filter is formed on the partition portion, the method further comprising forming an upper insulating layer covering the separation space, and
the upper insulating layer includes an inorganic layer.

8. The method of claim 5, wherein
the first color filter, the second color filter, and the third color filter respectively form a blue color filter, a red color filter, and a green color filter, and the blue color filter forms the partition portion.

9. The method of claim 2, further comprising
forming an organic layer on the first color filter, the second color filter, and the third color filter.

10. The method of claim 9, wherein
the first color filter, the second color filter, and the third color filter are formed to be separated from each other on the partition portion.

11. The method of claim 10, wherein
the separation space of the first color filter, the second color filter, and the third color filter is filled with the organic layer.

12. The method of claim 11, wherein
the first color filter forms the partition portion, and the first color filter is a blue color filter.

13. The method of claim 2, further comprising:
forming an upper insulating layer on the first color filter, the second color filter, and the third color filter; and
patterning the upper insulating layer to form a liquid crystal injection hole formation region,
wherein the liquid crystal injection hole formation region is formed along a direction that a gate line connected to the thin film transistor extends.

* * * * *